(12) United States Patent
Hatakeyama et al.

(10) Patent No.: US 7,078,781 B2
(45) Date of Patent: Jul. 18, 2006

(54) HIGH-BREAKDOWN-VOLTAGE SEMICONDUCTOR DEVICE

(75) Inventors: Tetsuo Hatakeyama, Yokohama (JP); Takashi Shinohe, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/942,000

(22) Filed: Sep. 16, 2004

(65) Prior Publication Data

US 2005/0029558 A1    Feb. 10, 2005

Related U.S. Application Data

(62) Division of application No. 10/393,914, filed on Mar. 24, 2003, now Pat. No. 6,855,970.

(30) Foreign Application Priority Data

Mar. 25, 2002    (JP) ............................. 2002-082409

(51) Int. Cl.
*H01L 27/095* (2006.01)
*H01L 29/861* (2006.01)
*H01L 29/00* (2006.01)

(52) U.S. Cl. ..................... 257/472; 257/481; 257/551
(58) Field of Classification Search ................ 257/264, 257/481, 471, 472, 551
See application file for complete search history.

(56) References Cited

U.S. PATENT DOCUMENTS 5,663,582 A    9/1997  Nishizawa et al.
6,252,288 B1 *    6/2001  Chang ....................... 257/471

OTHER PUBLICATIONS

J.P. Henning, et al., "A Novel Self-Aligned Fabrication Process for Microwave Static Induction Transisitors in Silicon Carbide", IEEE Electron Device Letters, vol. 21, No. 12, Dec. 2000, pp. 578-580.
K.J. Schoen, et al., "A Dual-Metal-Trench Schottky Pinch-Rectifier in 4H-SiC", IEEE Electron Device Letters, vol. 19, No. 4, Apr. 1998, pp. 97-99.

(Continued)

*Primary Examiner*—Steven Loke
(74) *Attorney, Agent, or Firm*—Oblon, Spivak, McClelland, Maier & Neustadt, P.C.

(57) ABSTRACT

A high-breakdown-voltage semiconductor device includes a high-resistance semiconductor layer, first trenches formed on the surface thereof in a longitudinal plane shape and in parallel, a Schottky electrode formed thereon and sandwiched between adjacent first trenches, a first region having an opposite conductivity type to the semiconductor layer continuously disposed in a sidewall and a bottom of each of the first trenches, a sidewall insulating film disposed on the sidewall, a second region of the opposite conductivity type disposed in the bottom of each of the first trenches, a third region disposed on the opposite surface of the semiconductor layer, a control electrode filling each of the first trenches in contact with the second region and connected to the Schottky electrode, a backside electrode formed on the third region, wherein second trenches communicate with the first trenches at both ends of longitudinal sides thereof, and the Schottky electrode is surrounded by the first and second trenches.

6 Claims, 17 Drawing Sheets

OTHER PUBLICATIONS

Jason P. Henning, "Design and Demonstration of C-Band Static Induction Transistors in 4H Silicon Carbide", Device Research Conference Digest 1999, 57th Annual 1999, pp. 48-49.

R.N. Gupta, et al., "A 600 V SiC Trench JFET", Materials Science Forum vols. 389-393, Trans Tech Publications, Switzerland, 2002, pp. 1219-1222.

* cited by examiner

HIGH-BREAKDOWN-VOLTAGE SEMICONDUCTOR DEVICE

CROSS-REFERENCE TO RELATED DOCUMENTS

The present patent document is a divisional of U.S. application ser. No. 10/393,914, filed on Mar. 24, 2003, now U.S. Pat. No. 6,855,970 and in turn claims the benefit of priority from the prior Japanese Patent Application No. 2002-082409, filed Mar. 25, 2002, the entire contents of each of which are hereby incorporated herein by reference.

BACKGROUND OF THE INVENTION

1. Field of the Invention

The present invention relates to a high-breakdown-voltage semiconductor device, particularly to high-breakdown-voltage semiconductor devices such as a power controlling static induction transistor, static induction thyristor, and diode.

2. Description of the Related Art

A semiconductor element for power control in which silicon carbide (hereinafter abbreviated as SiC) is used as a wide gap semiconductor material has superior characteristics of high speed and low loss as compared with a related-art element in which silicon is used. There has been a demand for practical use of the semiconductor element. In recent years, a large number of semiconductor elements using SiC, such as a Schottky barrier diode, MOSFET, and static induction transistor (hereinafter abbreviated as SIT) have been presented. It has been confirmed that the properties of the elements are far superior to those of an element using silicon.

A structure and manufacturing method of a related-art typical SIT will be described hereinafter. An $n^+$ layer (source) is formed on one surface of an $n^-$ drift layer, a $p^+$ layer (gate) is formed in the periphery, and further an $n^+$ layer (drain) is formed on the other surface of the $n^-$ drift layer. Source, gate, and drain electrodes are disposed in the $n^+$ layer (source), $p^+$ layer (gate), and $n^+$ layer (drain), respectively.

In the SIT, a current is passed between the source and drain, and is controlled by a bias of the gate. When a negative bias is applied to the gate, a depletion layer spreads. In this structure, a channel width through which a current passes is controlled to change a current value. That is, when the gate is positively biased with respect to the source, the spread of the depletion layer in the channel between the adjacent gates is small, the channel width broadens, and an on state is obtained. On the other hand, when the gate is negatively biased with respect to the source, the depletion layer spreads over the whole channel width between the adjacent gates, and an off state is obtained.

When the depletion layer is spread to control the current path, and a breakdown voltage in applying a reverse voltage is raised, it is necessary to deepen a gate region and narrow the channel width. On the other hand, in order to lower an on resistance per area of SIT, a ratio occupied by a source region with respect to an element region needs to be increased, and both the gate and source require fine processing. Moreover, it is very difficult to deepen the gate region because of a small diffusion coefficient of impurities in SiC.

To solve these problems, an element structure has also been proposed in which a trench is formed in a substrate and the gate is formed inside the trench (e.g., Henning, J. P.; Przadka, A.; Melloch, M. R.; Cooper, J. A., Jr.: IEEE Electron Device Letters, Volume: 21 Issue; 12 Dec. 2000, Page(s): 578–580). In this case, the following sophisticated processing technique is used to form the gate inside the trench. That is, the technique comprises: forming a metal film along a trench shape in the whole surface of the substrate including the inside of the trench; coating the surface with a resist; and allowing the resist to reflow and pool only in the trench. Thereafter., the technique comprises: using the resist pooled only in the trench as a mask to etch the metal film; and selectively leaving the metal film in contact with the bottom and lower side surface of the trench to form the gate electrode.

However, when the resist is allowed to reflow in the above-described method, there is a problem that the resist also easily remains outside the trench. In this case, when a pattern of the resist generated by the reflow is used as the mask to etch the surface, the metal film also remains outside the trench, and electric short-circuit or deterioration of flatness of the element surface is caused. There is a problem that manufacturing yield is deteriorated and element properties are also deteriorated.

On the other hand, for a switch-off property of a SIT, in the element in which the metal film is selectively left in contact with the bottom and lower side surface of the trench to form the gate electrode, the spread of the depletion layer in the width direction of the channel cannot be said to be necessarily sufficient. There is a problem that the switch-off property is not sufficient. This problem similarly exists in the switch-off property of a junction barrier Schottky diode (hereinafter abbreviated as JBS). In the JBS, a p-type semiconductor layer is selectively disposed around a Schottky junction, and the depletion layer is extended into an n-type high-resistance semiconductor layer from a pn junction between the p-type semiconductor layer and n-type high-resistance semiconductor layer so that the switch-off property is improved. In the element in which a control electrode is formed in the p-type semiconductor layer in the above-described method, it cannot be said that the spread of the depletion layer is sufficient, and there is a problem that the switch-off property is not sufficient.

Therefore, there has been a demand for realization of a high-breakdown-voltage semiconductor device in which superior element properties can be obtained and manufacturing yield is improved.

BRIEF SUMMARY OF THE INVENTION

According to a first aspect of the present invention, there is provided a high-breakdown-voltage semiconductor device comprising:

a high-resistance semiconductor layer of a first conductivity type having a first and a second main surface, a plurality of first trenches being formed on the first main surface of the high-resistance semiconductor layer in a longitudinal plane shape and arranged in parallel with each other;

a plurality of first semiconductor regions of the first conductivity type formed on the first main surface of the high-resistance semiconductor layer, each of the plurality of first semiconductor regions being sandwiched between adjacent ones of the plurality of first trenches, and having an impurity concentration higher than that of the high-resistance semiconductor layer;

a second semiconductor region of a second conductivity type continuously disposed in a sidewall and a bottom portion of each of the plurality of first trenches;

a sidewall insulating film disposed on the second semiconductor region of the sidewall of each of the plurality of first trenches;

a third semiconductor region of the second conductivity type disposed in a surface region of the second semiconductor region of the bottom portion of each of the plurality of first trenches and having an impurity concentration higher than that of the second semiconductor region;

a fourth semiconductor region disposed on the second main surface of the high-resistance semiconductor layer and having an impurity concentration higher than that of the high-resistance semiconductor layer;

a first electrode formed on each of the plurality of first semiconductor regions;

a second electrode filling each of the plurality of first trenches and in contact with the third semiconductor region; and a third electrode formed on the fourth semiconductor region.

Moreover, according to a second aspect of the present invention, there is provided a high-breakdown-voltage semiconductor device comprising:

a high-resistance semiconductor layer of a first conductivity type having a first and a second main surface, a plurality of first trenches being formed on the first main surface of the high-resistance semiconductor layer in a longitudinal plane shape and arranged in parallel with each other;

a first electrode formed on each of surface regions of the first main surface of the high-resistance semiconductor layer to form a Schottky junction therewith, each of the surface regions being sandwiched between adjacent trenches of the plurality of first trenches;

a first semiconductor region of a second conductivity type continuously disposed in a sidewall and a bottom portion of each of the plurality of first trenches;

a sidewall insulating film disposed on the first semiconductor region of the sidewall of each of the plurality of first trenches;

a second semiconductor region of the second conductivity type disposed in a surface region of the first semiconductor region of the bottom portion of each of the plurality of first trenches and having an impurity concentration higher than that of the first semiconductor region;

a third semiconductor region of the first conductivity type disposed on the second main surface of the high-resistance semiconductor layer and having an impurity concentration higher than that of the high-resistance semiconductor layer;

a control electrode filling each of the plurality of first trenches in contact with the second semiconductor region and connected to the first electrode; and a second electrode formed on the third semiconductor region.

Furthermore, according to a third aspect of the present invention, there is provided a high-breakdown-voltage semiconductor device comprising:

a high-resistance semiconductor layer of a first conductivity type having a first and a second main surface, a plurality of first trenches being formed on the first main surface of the high-resistance semiconductor layer in a longitudinal plane shape and arranged in parallel with each other;

a plurality of first semiconductor regions of the second conductivity type formed on the first main surface of the high-resistance semiconductor layer, each of the plurality of first semiconductor regions being sandwiched between adjacent trenches of the plurality of first trenches, and having an impurity concentration higher than that of the high-resistance semiconductor layer;

a second semiconductor region of the first conductivity type disposed in at least a bottom portion of each of the plurality of first trenches and having an impurity concentration higher than that of the high-resistance semiconductor layer;

a sidewall insulating film disposed on the sidewall of each of the plurality of first trenches;

a third semiconductor region of the second conductivity type buried in the high-resistance semiconductor layer, a part of an upper surface thereof contacting a lower surface of the second semiconductor region and horizontally extending under the second semiconductor region to terminate under the first semiconductor region;

a fourth semiconductor region disposed on the second main surface of the high-resistance semiconductor layer, and having an impurity concentration higher than that of the high-resistance semiconductor layer;

a first electrode formed on each of the plurality of first semiconductor regions;

a second electrode formed on the second semiconductor region;

a third electrode formed on the third semiconductor region and in contact with a surface thereof; and a fourth electrode formed on the fourth semiconductor region.

BRIEF DESCRIPTION OF THE SEVERAL VIEWS OF THE DRAWING

FIG. 1 shows a section along line I—I of FIG. 3 and corresponds to a partial sectional view extending to an edge termination region from the vicinity of an element middle;

DETAILED DESCRIPTION OF THE INVENTION

Embodiments of the present invention will be described hereinafter in detail with reference to the drawings.

First Embodiment

A first embodiment relates to a high-breakdown-voltage semiconductor device (SIT).

First, structural characteristics and effect in the SIT of the present embodiment will be described.

Figure 1:
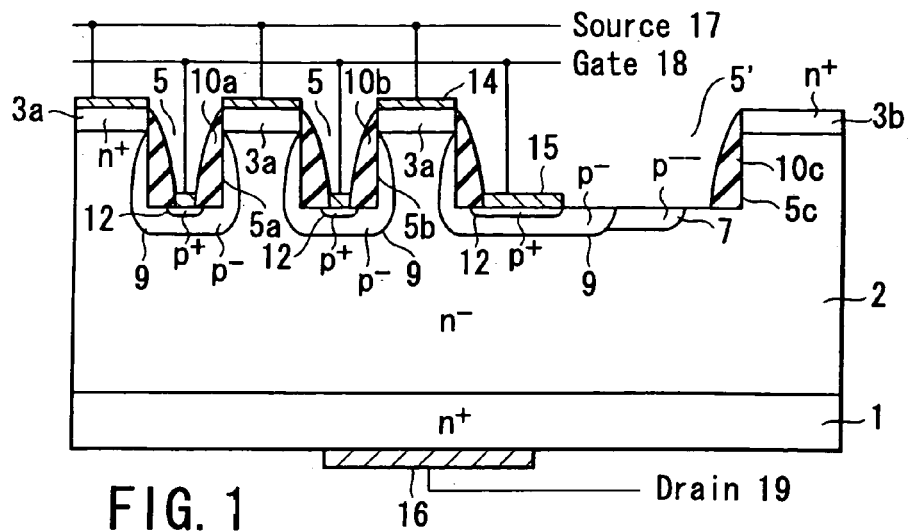
FIG. 1 is a schematic and partial sectional view of a high-breakdown-voltage semiconductor device (SIT) according to a first embodiment of the present invention.

As shown in FIG. 1, in one surface of an n-type high-resistance semiconductor layer (SiC layer), an n-type first semiconductor region (SiC layer) 3a is selectively disposed as a source region which has a resistance lower than that of a high-resistance semiconductor layer 2 (higher impurity concentration). The impurity concentration and thickness of the high-resistance semiconductor layer 2 are determined by a designed breakdown voltage. For example, the impurity concentration is in a range of $1\times10^{14}$ to $1\times10^{16}$ cm$^{-3}$ and the thickness is in a range of 5 to 100 µm. The source region 3a has an impurity concentration, for example, of $1\times10^{20}$ cm$^{-3}$. Examples of an n-type dopant for use include nitrogen, phosphor, and arsenic.

Figure 2:
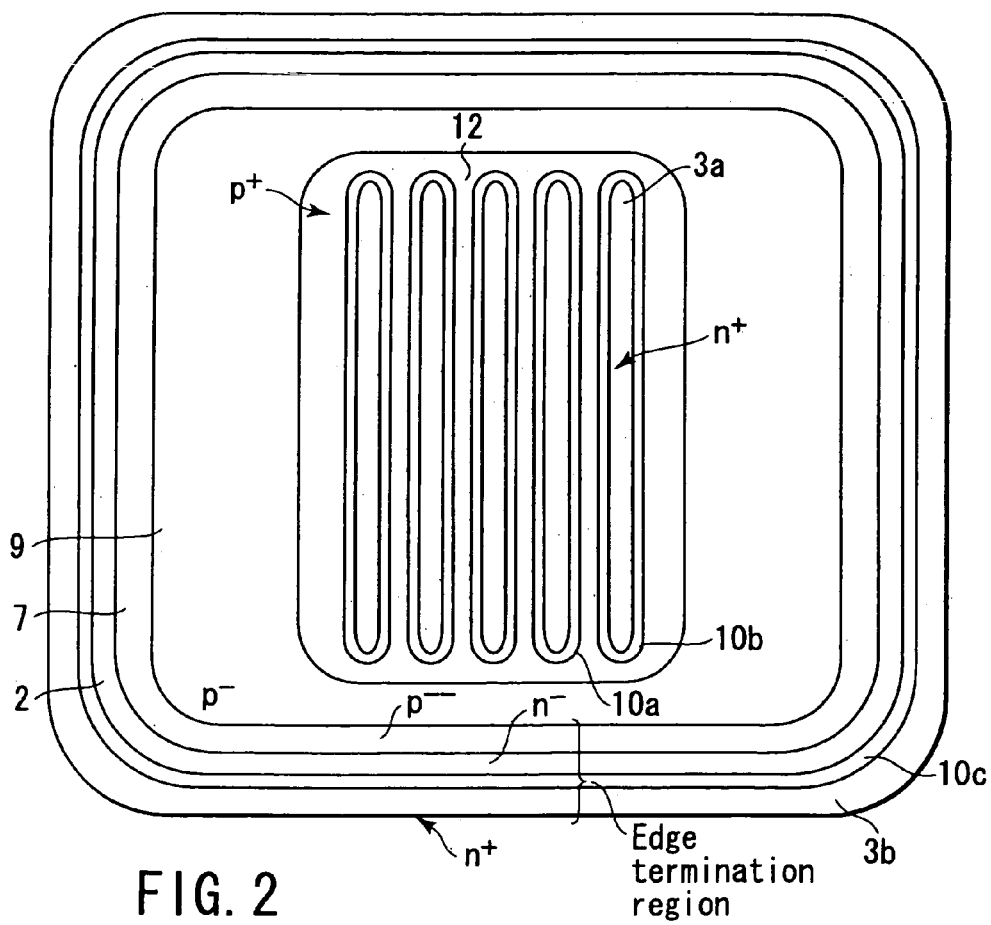
FIG. 2 is a top plan view of the high-breakdown-voltage semiconductor device excluding an electrode according to the first embodiment of the present invention.
Figure 3:
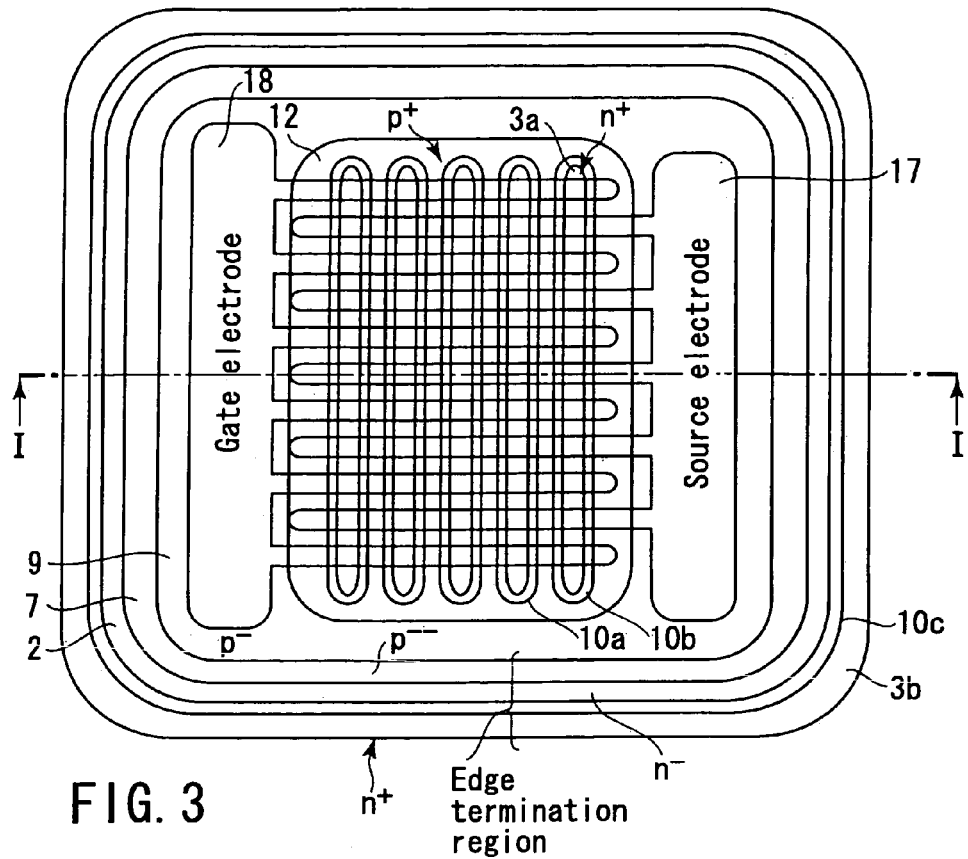
FIG. 3 is a top plan view of the high-breakdown-voltage semiconductor device including the electrode according to the first embodiment of the present invention.

As shown in FIGS. 1 to 3, trench portions 5 and 5' are disposed in the high-resistance semiconductor layer 2 around the source region 3a, and the width of the trench portion 5 is smaller than that of the trench portion 5'. The trench portion 5 is formed only in an element region, and the trench portion 5' is formed to an edge termination region from the element region.

As shown in FIG. 1, the trench portions 5 and 5' are disposed in the form of dug portions of the high-resistance semiconductor layer 2 around the source region 3a. The source regions 3a are disposed in the upper surfaces of a plurality of insular convex portions surrounded by the trench portions 5 and 5'. In the section of FIG. 1, for example, the trench portions 5 and 5' have widths of 1 µm and 100 µm, and the width of the insular convex portion between the trench portions 5 and 5' is, for example, 1 µm.

As gate layers, p-type second semiconductor layers (SiC layers) 9 are disposed in side surfaces 5a and 5b of the trench portion 5. The side surfaces 5a and 5b are described as examples, but the other side surfaces of the trench portion 5 are of course similar. Typically, for example, the gate layer 9 has an impurity concentration of $1\times10^{18}$ cm$^{-3}$. Examples of a p-type dopant include aluminum and boron.

The gate layers 9 are also partially disposed in one side surface and bottom surface of the trench portion 5'. The bottom surface corner of the gate layer 9 is formed to swell toward the high-resistance semiconductor layer 2. The gate layer 9 has a maximum thickness, for example, of 0.3 µm in the bottom surfaces of the trench portions 5 and 5', and has a maximum thickness, for example, of 0.1 µm in the side surfaces 5a and 5b of the trench portions 5 and 5'.

Moreover, sidewall insulating films 10a and 10b are selectively disposed in the gate layers 9 of the side surfaces 5a and 5b of the trench portion 5. As shown in FIGS. 2 and 3, these sidewall insulating films 10a and 10b are formed to surround outer peripheries of the plurality of insular convex portions. A sidewall insulating film 10c is also selectively disposed in the other side surface 5c of the trench portion 5'. As shown in FIGS. 2 and 3, the sidewall insulating film 10c is formed along the inside of an outer peripheral portion 3b of the device.

Furthermore, a p-type third semiconductor layer (SiC layer) 12 is selectively disposed as a gate contact layer in the portion of the gate layer 9 in the bottom surface of the trench portion 5, and is exposed between the sidewall insulating films (spacer layers) 10a and 10b.

The gate contact layer 12 is also disposed in the gate layer 9 of the bottom surface of the trench portion 5'. This gate contact layer 12 contacts the sidewall insulating film 10b only on one side. The gate contact layer 12 has an impurity concentration, for example, of $1\times10^{20}$ cm$^{-3}$. Examples of the p-type dopant for use include aluminum.

On the other hand, an n-type fourth semiconductor layer (SiC layer) 1 is disposed as a drain layer on the other surface of the n-type high-resistance semiconductor layer 2. The drain layer 1 has an impurity concentration, for example, of $1\times10^{19}$ cm$^{-3}$. Examples of the n-type dopant include nitrogen, phosphor, and arsenic.

A source electrode 14, gate electrode 15, and drain electrode 16 are disposed on the surfaces of the source region 3a, gate contact layer 12, and drain layer 1, respectively. Furthermore, the source electrode 14, gate electrode 15, and drain electrode 16 include a source electrode lead wire 17, gate electrode lead wire 18, and drain electrode lead wire 19, respectively.

As shown in FIG. 3, the source electrode lead wire 17 is formed of a large-area electrode pad portion and a plurality of striped connection electrode portions for electrically connecting the electrode pad portion to each source electrode 14, and has a comb-teeth-like pattern.

The gate electrode lead wire 18 is similarly formed of the broad-area electrode pad portion and a plurality of striped connection electrode portions for electrically connecting the electrode pad portion to the gate electrode 15, and has the comb-teeth-like pattern. These source electrode lead wire 17 and gate electrode lead wire 18 are laid so as to mesh with each other.

Figure 4:
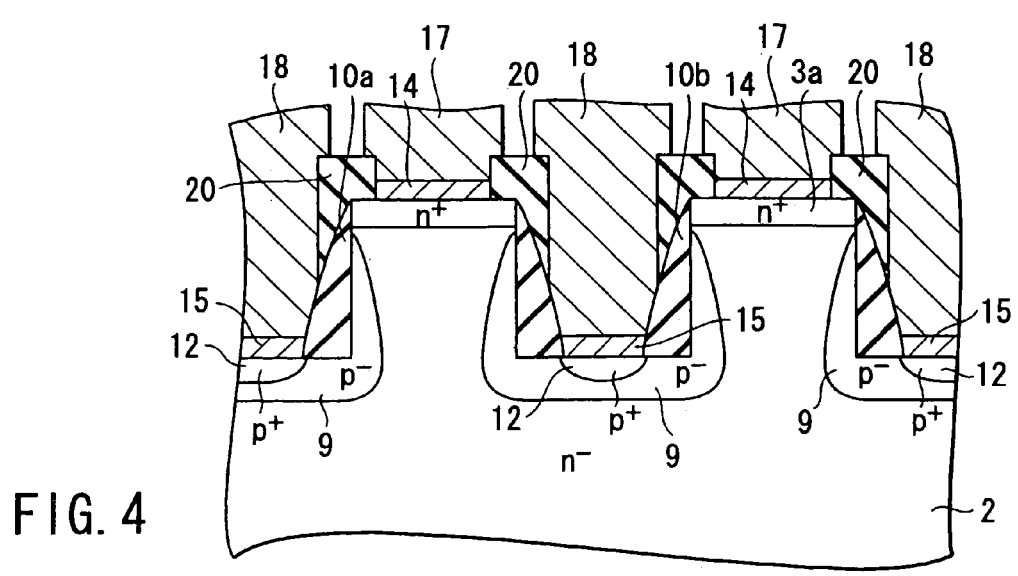
FIG. 4 is a schematic sectional view showing a contact structure of the semiconductor device according to the first embodiment, and corresponds to the section along the line I—I of FIG. 3.

A contact structure of each electrode schematically shown in FIG. 1 is shown in FIG. 4. In detail, insulating films 20 including a trench structure are formed over the whole surface, and this insulating film includes contact holes connected to the source electrode 14 and gate electrode 15. To fill in these contact holes, the source electrode lead wire 17 and gate electrode lead wire 18 connected to the source electrode 14 and gate electrode 15, respectively, are disposed.

It is to be noted that for the sake of convenience in description, FIG. 4 shows the source electrode lead wire 17 and gate electrode lead wire 18 in the same sectional view. However, these wires deviate from each other in a direction vertical to the sheet surface of the drawing. Only the gate electrode lead wire 18 originally appears in the sectional view.

Moreover, although not shown in FIG. 4, the gate electrode lead wire 18 extends over the surface of the insulating film 20, an interlayer insulating film is formed over the insulating film 20 and gate electrode lead wire 18, and the source electrode lead wire 17 is drawn to the surface of the interlayer insulating film, and extends over the surface of the interlayer insulating film.

Next, the edge termination region will be described. As shown in FIGS. 1 to 3, a RESURF layer 7 is disposed in contact with the gate layer 9 in the outer periphery of the gate layer 9 in the bottom surface of the trench portion 5'. The RESURF layer 7 has an impurity concentration, for example, of $3 \times 10^{17}$ cm$^{-3}$ and a depth of 0.6 µm. Additionally, an optimum value of the structure of the RESURF layer differs with a process condition. Examples of the p-type dopant for use include aluminum and boron.

The surface of a part of the high-resistance semiconductor layer 2 appears in the trench portion 5' bottom surface between the sidewall insulating film 10c and RESURF layer 7 positioned in the side surface 5c of the trench portion 5'. Moreover, the n-type semiconductor layer 3b is disposed in the upper surface of a step in the outer periphery of the trench portion 5'. The n-type semiconductor layer 3b has an impurity concentration, for example, of $1 \times 10^{19}$ cm$^{-3}$. Examples of the n-type dopant for use include nitrogen, phosphor, and arsenic. The above-described components configure an edge termination structure.

One of characteristics of the element structure of the present embodiment lies in that the gate electrode lead wire 18 is buried in the trench portions 5 and 5' via the sidewall insulating films 10a and 10b in the side surfaces 5a and 5b, and the gate contact layer 12 and gate electrode 15 are selectively disposed on the portion of the gate layer 9 exposed from the sidewall insulating films 10a and 10b. That is, the gate electrode lead wires 18 do not directly contact the gate layers 9 of the side surfaces 5a and 5b of the trench portions 5 and 5', and contact the gate contact layers 12 of the bottom surfaces of the trench portions 5 and 5' only via the gate electrodes 15. The gate contact layers 12 or gate electrodes 15 are formed with respect to the sidewall insulating films 10a and 10b in a self-aligning manner, and are therefore correctly positioned in center regions of the bottom surfaces of the trench portions 5 and 5'.

By this configuration, a gate potential can selectively be applied to the bottom surfaces of the trench portions 5 and 5' via the gate electrode lead wires 18, and the gate potential is not directly applied to the gate layers 9 of the side surfaces 5a and 5b of the trench portions 5 and 5'. Therefore, a gate voltage can preferentially be applied to the gate layer 9 portions positioned adjacent to the corners of the bottom surfaces of the trench portions 5 and 5', so that the depletion layer can dominantly extend in the high-resistance semiconductor layer 2 disposed adjacent to the gate layer 9 portion. The gate layer 9 portion is formed in a swelling shape toward the high-resistance semiconductor layer 2. Therefore, the extension of the depletion layer in this portion is dominantly used to switch off, so that switch-off property can be improved.

Moreover, another characteristic of the element structure of the present embodiment lies in that the source region 3a in the upper end of the trench portion 5 and the gate contact layer 12 in the bottom surface of the trench portion 5 are formed in the self-aligning manner. Therefore, there is not an influence of alignment shift at metalization, it is possible to form the trench structure finely to a limit of an exposure unit, and miniaturization is facilitated.

Furthermore, as shown in FIG. 4, the source electrode 14 and gate electrode 15 are connected to the source electrode lead wire 17 and gate electrode lead wire 18 in the upper layer through the contact holes of the insulating film 20. That is, alignment precision is required between the source electrode or gate electrode and the contact hole in the miniaturized structure. However, as shown in FIG. 4, an insulating material is selected to obtain an etching selectivity between the sidewall insulating films (spacer layers) 10a and 10b and the insulating film 20. Thereby, an alignment margin between the contact hole and the source electrode or gate electrode is obtained for the sidewall insulating films 10a and 10b. Therefore, the miniaturization is facilitated. For example, silicon nitride can be used in the materials of the sidewall insulating films 10a and 10b, and silicon oxide can be used in the material of the insulating film 20.

When the element structure can be miniaturized in this manner, the width of the channel between each source region 3a and drain layer 1 can be reduced. Therefore, the depletion layer easily spreads over the whole channel width in an off state. It is therefore possible to prevent an increase of a pinch-off voltage which has been a difficulty unique to SIT. Therefore, the element can more securely be switched off, and it is possible to largely enhance reliability of the element.

Moreover, the whole source region 3a and gate contact layer 12 can be coated with the source electrode 14 and gate electrode 15, so that a contact resistance and resistance (on resistance) at a device energizing time can be reduced. Furthermore, since a large amount of current can be supplied also to the gate electrode 15 at a switching time, high-speed switching is possible.

Additionally, according to the device of the present embodiment, as shown in FIGS. 1 to 3, the RESURF layer 7 is disposed in contact with the gate layer 9 in the outer periphery of the gate layer 9 in the bottom surface of the trench portion 5', so that the element can obtain a high breakdown voltage at a switch-off time. Especially, since the RESURF layer 7 is disposed together with the gate layer 9 in the bottom surface of the trench portion 5', the gate layer 9 surface and RESURF layer 7 surface can be positioned on the same plane. Electric field concentration in the corner of the gate layer 9 can be minimized by the depletion layer by the RESURF layer 7, and an effect which contributes to the high breakdown voltage is large.

Moreover, it is possible to obtain an effect that the margin of the positional shift of the electrode formed on a channel stopper (n-type semiconductor layer 3b) can be increased by the sidewall insulating film 10c formed in the side surface 5c of the trench portion 5'.

Next, a method of manufacturing the SIT (FIG. 1) of the present embodiment will be described with reference to FIGS. 5 to 12. These drawings correspond to the sectional view along line I—I of FIG. 3.

Figure 5:
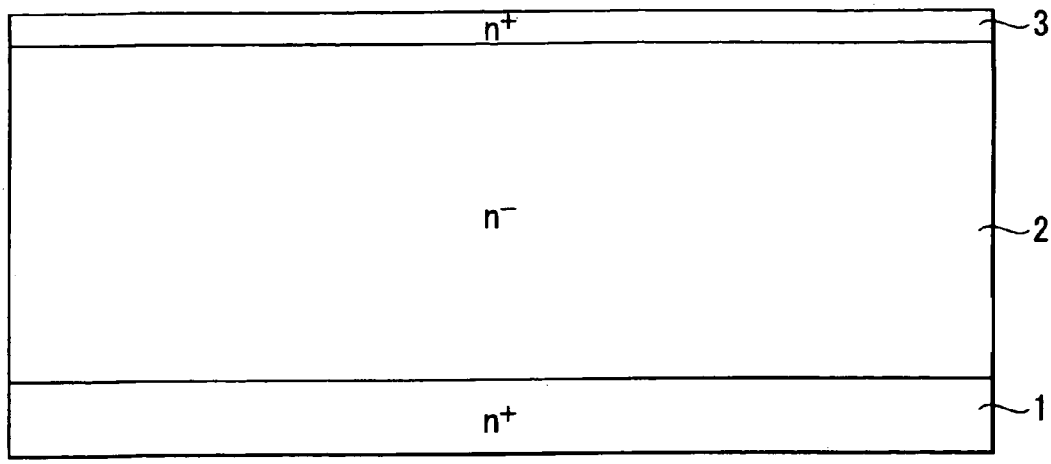
FIGS. 5 to 12 are sectional views showing steps of a manufacturing process of the high-breakdown-voltage semiconductor device (SIT) according to the first embodiment.

First, as shown in FIG. 5, the n-type high-resistance semiconductor layer (SiC layer) 2 is formed on the n-type heavily-doped substrate (SiC substrate) 1 by an epitaxial growth method. The n-type heavily-doped substrate 1 corresponds to the n-type fourth semiconductor region (SiC layer) 1 which is the drain region. Furthermore, an n-type low-resistance first semiconductor layer (SiC layer) 3 is formed on the high-resistance semiconductor layer 2. This n-type first semiconductor layer 3 forms the source region 3a. The first semiconductor layer 3 is formed by ion-implanting n-type impurities in the high-resistance semiconductor layer 2 or by epitaxially growing the layer on the high-resistance semiconductor layer 2.

Figure 6:
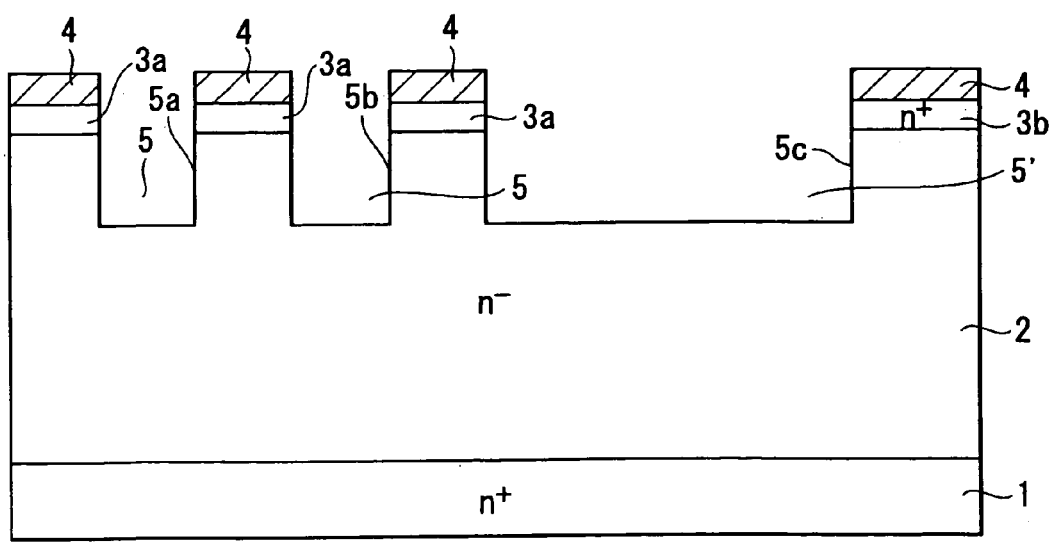

Next, as shown in FIG. 6, a mask pattern 4 is formed on the first semiconductor layer 3, and this mask pattern 4 is used to perform reactive ion etching (RIE). Thereby, the trench portions 5 and 5' extending to the high-resistance semiconductor layer 2 from the surface of the first semiconductor layer 3 are formed. The width of the trench portion 5 is formed to be smaller than that of the trench portion 5'.

In this case, as the material of the mask pattern 4, metals having a large resistance to etching, such as molybdenum, aluminum, and tungsten, or a laminated film of these metals can be used. Fluorine-based gases such as $CF_4$ and $SF_6$ can be used as an etching gas. As a result of this etching step, the first semiconductor layer 3 can be pattern-processed to form the source region 3a and n-type semiconductor region 3b.

Figure 7:
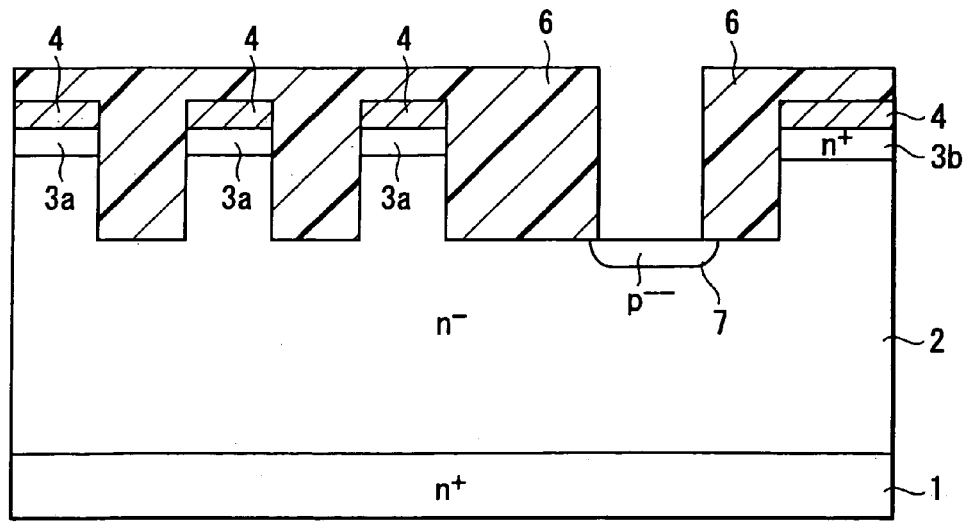

Next, as shown in FIG. 7, a resist pattern 6 is formed to extend over the trench portion 5 and expose a part of the bottom surface of the trench portion 5', and this resist pattern 6 is used as the mask to ion-implant p-type impurities. The RESURF layer 7 is selectively formed in a part of the bottom of the trench portion 5' by the ion implantation.

Figure 8:
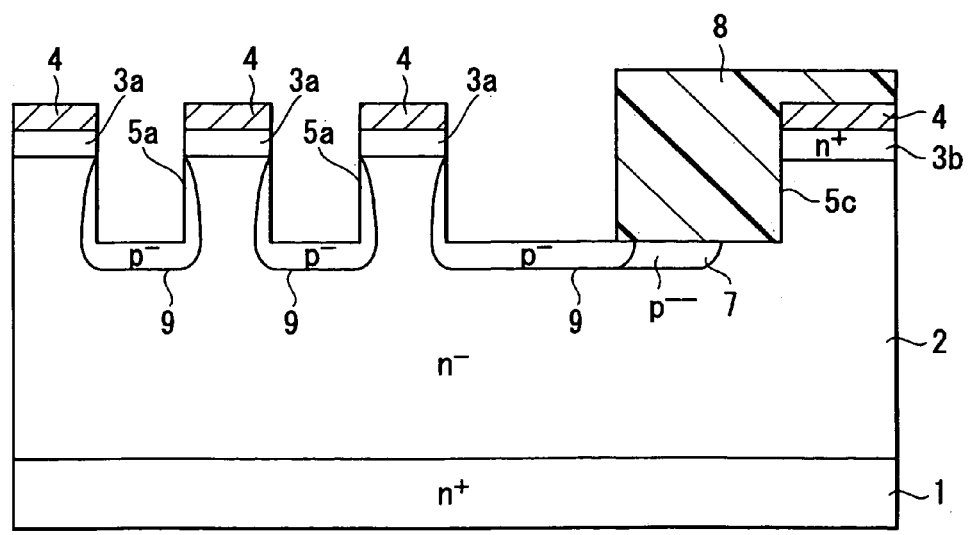

Next, as shown in FIG. 8, the mask pattern 4 is left while the resist pattern 6 is removed. A resist pattern 8 is newly formed to extend over the n-type semiconductor layer 3b and RESURF layer 7. This resist pattern 8 is used as the mask to ion-implant the p-type impurities. The p-type gate layers 9 are selectively formed in the side surfaces 5a and 5b and bottom surface of the trench portion 5 by the ion implantation. Additionally, the gate regions 9 are selectively formed in the portion disposed adjacent to the RESURF layer 7 of the trench portion 5' bottom surface and the side surface 5b.

In this case, when the gate layer 9 is doped as heavily as possible, the function of the gate is improved. When the heavily-doped gate layer 9 is formed in the vicinity of the source region 3a, a source-gate breakdown voltage drops. Therefore, it is preferable to change an angle, dosage, and acceleration voltage of ion implantation while multiple ion implantation is performed, and to adjust or reduce a doping amount in the vicinity of the source region 3a. By the above-described ion implantation step, the gate region 9 is formed so that the bottom surface corners of the region swell toward the high-resistance semiconductor layer 2.

Figure 9:
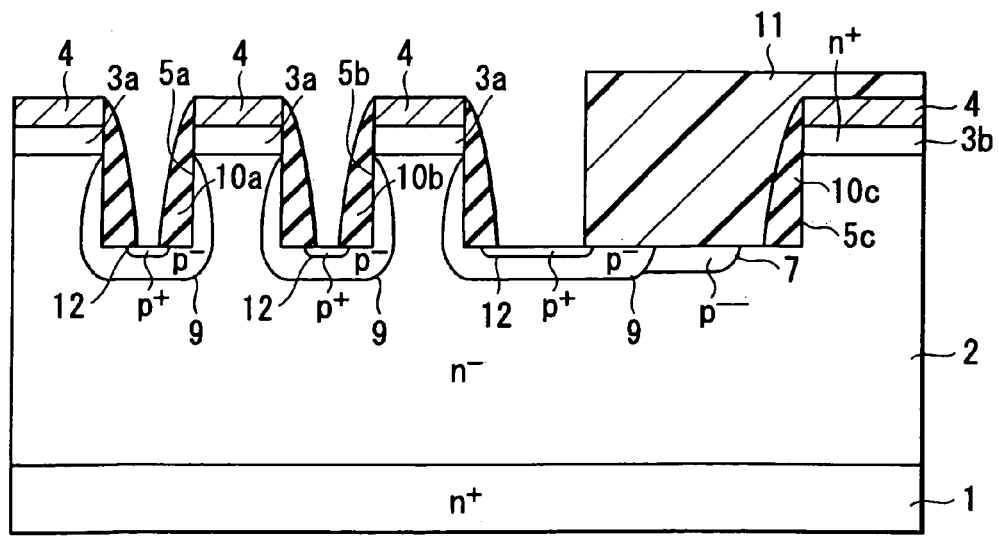

Next, as shown in FIG. 9, the mask pattern 4 is left while the resist pattern 8 is removed. Furthermore, a continuous film formed of silicon nitride is formed over the whole surface including the trench portions 5 and 5' by a CVD method. The whole surface of the continuous film is anisotropically etched (RIE) to selectively leave the sidewall insulating films 10a, 10b, and 10c on the side surfaces 5a, 5b, and 5c of the trench portions 5 and 5'.

Thereafter, a resist pattern 11 is newly formed to extend over the n-type semiconductor region 3b and the gate region 9 disposed adjacent to the RESURF layer 7. This resist pattern 11 is used as the mask to ion-implant the p-type impurities. The p-type gate contact regions 12 are selectively formed in the bottom surfaces of the trench portions 5 and 5' by the ion implantation.

Figure 10:
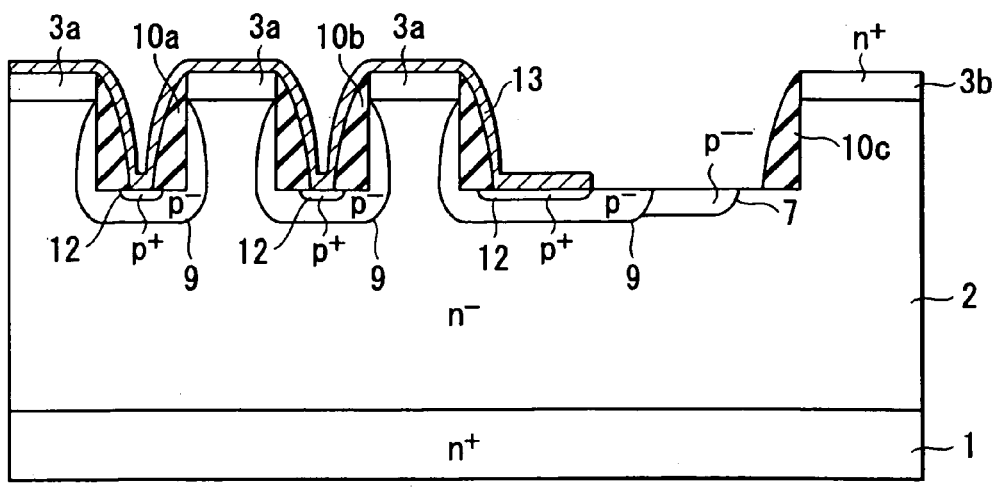

Next, as shown in FIG. 10, the mask pattern 4 and resist pattern 11 are removed. In this step, the surfaces of the sidewall insulating films 10a, 10b, and 10c extend backwards, and the upper ends of the sidewall insulating films 10a, 10b, and 10c substantially agree with the upper surfaces of the source region 3a and n-type semiconductor region 3b. Furthermore, for example, on a high-temperature condition at 1600° C., the source region 3a, n-type semiconductor region 3b, gate region 9, and gate contact region 12 are annealed to be activated.

Thereafter, a resist mask (not shown) is formed to extend over the n-type semiconductor region 3b and the peripheral portion of the gate contact region 12, and a metal film formed of Ni is formed on the whole surface including the resist mask. Furthermore, the resist mask is removed, a lift-off method is performed, and the metal film is patterned to form a metal pattern 13 (FIG. 10).

Figure 11:
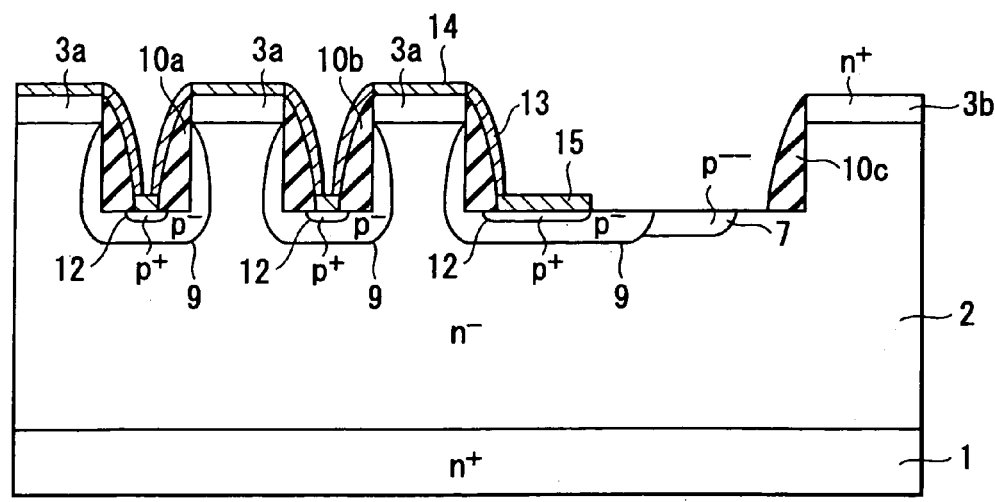

Thereafter, as shown in FIG. 11, the metal pattern 13 is annealed, for example, at 1000° C., and silicidation reaction is allowed to proceed in the surfaces of the source region 3a and gate contact region 12 to form the nickel silicide (e.g., $Ni_2Si$) layers 14 and 15 on the respective surfaces. The silicidation reaction does not occur in the surfaces of the sidewall insulating films 10a and 10b, and a part of the metal pattern 13 remains in this portion.

Figure 12:
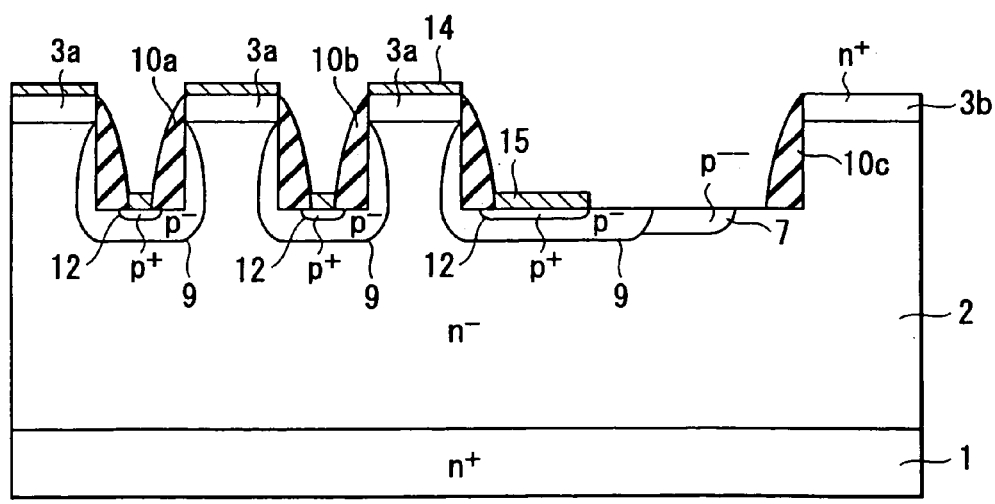

Furthermore, as shown in FIG. 12, etchants such as a mixed solution (SC2) of hydrochloric acid and hydrogen peroxide are used to selectively etch/remove the remaining metal pattern 13, and the nickel silicide layers 14 and 15 are selectively left in the surfaces of the source region 3a and gate contact region 12. The nickel silicide layers 14 and 15 form the source electrode 14 and gate electrode 15. It is to be noted that the nickel silicide layer is selectively formed also on the surface of the n-type semiconductor region 3b so that the contact resistance of this portion can be reduced. In this case, in the above-described step, the metal pattern 13 may also be formed on the n-type semiconductor region 3b.

Next, a usual wiring step is carried out to complete the SIT of the present embodiment shown in FIG. 1. That is, the drain electrode 16 is formed on the surface of the drain region 1, further the source electrode lead wire 17, and gate electrode lead wire 18, and drain electrode lead wire 19 are disposed in the source electrode 14, gate electrode 15, and drain electrode 16 to complete the SIT of the first embodiment.

Second Embodiment

Figure 13:
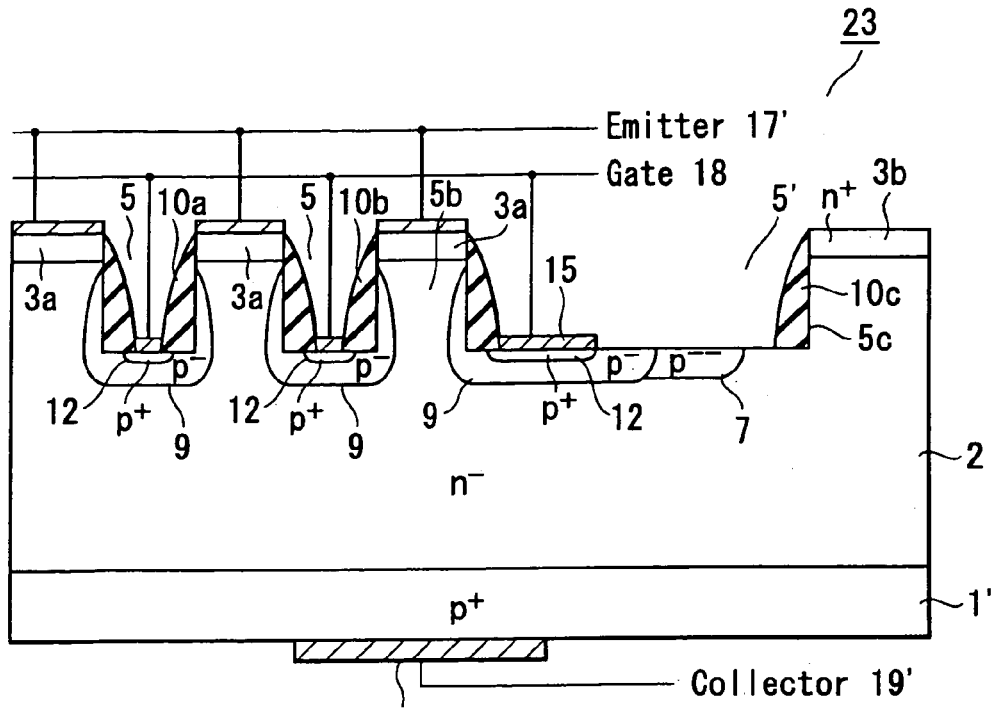
FIG. 13 is a schematic partial sectional view of the high-breakdown-voltage semiconductor device (SI thyristor) according to a second embodiment.

FIG. 13 is a sectional view of the high-breakdown-voltage semiconductor device (SI thyristor) according to a second embodiment of the present invention. An n+ layer on the back surface in the first embodiment (FIG. 1) is changed to a p+ layer, and the static induction (SI) thyristor can be formed. Since the configuration is similar to that of the first embodiment, the same components are denoted with the same reference numerals, and redundant description is omitted. Moreover, a top plan view is the same as FIG. 2, and is therefore omitted.

First, the structural characteristics and effect in the SI thyristor of the present embodiment will be described. As shown in FIG. 13, on one surface (back surface) of the n-type high-resistance semiconductor layer (SiC layer) 2, a low-resistance p+-type semiconductor layer 1' is disposed as a collector layer. Reference numeral 16' denotes a collector electrode, and 19' denotes a collector electrode lead wire.

The impurity concentration and thickness of the high-resistance semiconductor layer 2 are determined by designed breakdown voltage. For example, the impurity concentration is in a range of $1 \times 10^{14}$ to $1 \times 10^{16}$ $cm^{-3}$ and the thickness is in a range of 5 to 100 μm. The collector layer 1' has an impurity concentration, for example, of $1 \times 10^{19}$ cm$^{-3}$. Examples of the n-type dopant for use include nitrogen, phosphor, and arsenic.

Reference numeral 14' denotes an emitter electrode, and 17' denotes an emitter electrode lead wire. The other electrode structure is substantially the same as that of the first embodiment. For example, the edge termination structure (RESURF layer) 7 is a p-type lightly-doped layer, the impurity concentration is, for example, $3 \times 10^{17}$ $^{cm-3}$, and the depth is 0.6 µm.

The characteristic of the second embodiment lies in that the gate electrode and emitter electrode are formed in the self-aligning manner. Therefore, a useless region for allowing a mask shift is unnecessary, and the resistance value per area can be inhibited from being increased by the useless region. Moreover, since the gate electrode is in the upper part of the buried p-type layer, capacity between gate and collector is small, and high-speed operation is possible.

Figure 14:
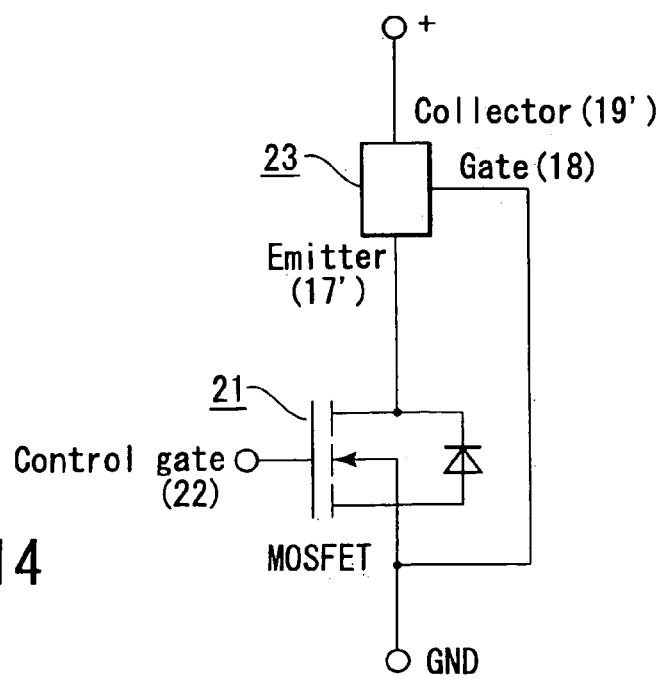
FIG. 14 is a circuit diagram of a switch circuit of cascode connection in which the high-breakdown-voltage semiconductor device according to the second embodiment is used.

Moreover, when the SI thyristor 23 and MOSFET 21 form a circuit referred to as Cascode connection shown in FIG. 14, the circuit can be operated as a normally off switch element from the outside in the same manner as in usual MOSFET. A hole accumulated in the element at an off operation time in this circuit is discharged via the gate electrode lead wire 18. However, since the gate electrode is connected to GND, the current does not flow into the control gate of the MOSFET 21. Therefore, there is an advantage that the capacity of a gate power source is reduced.

Third Embodiment

The high-breakdown-voltage semiconductor device of a third embodiment relates to a junction barrier Schottky diode (JBS).

Figure 15:
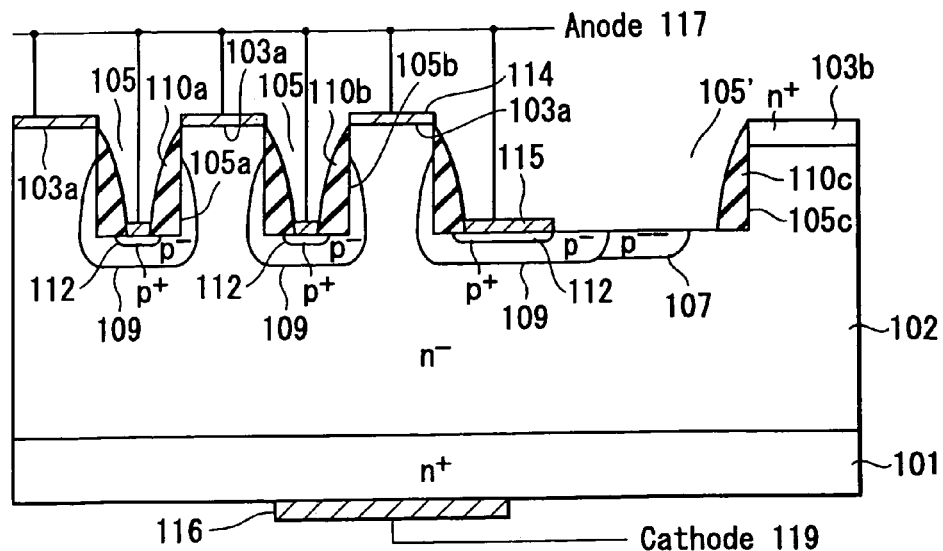
FIG. 15 is a schematic partial sectional view of the high-breakdown-voltage semiconductor device (JBS) according to a third embodiment.

First, the structural characteristic and effect in the JBS of the present embodiment will be described. As shown in FIG. 15, on one surface of an n-type high-resistance semiconductor layer (SiC layer) 102, a Schottky electrode 114 is disposed to form Schottky junction in with this high-resistance semiconductor layer 102. Reference numeral 103a denotes a Schottky junction region. The impurity concentration and thickness of the high-resistance semiconductor layer 102 are determined by the designed breakdown voltage. For example, the impurity concentration is in a range of $1 \times 10^{14}$ to $1 \times 10^{16}$ cm$^{-3}$ and the thickness is in a range of 5 to 50 µm. Furthermore, when conduction modulation is used, the thickness may also be 100 µm. Examples of the n-type dopant for use include nitrogen, phosphor, and arsenic. Examples of the material of the Schottky electrode 114 for use include titanium (Ti), nickel (Ni), and molybdenum (Mo).

Figure 16:
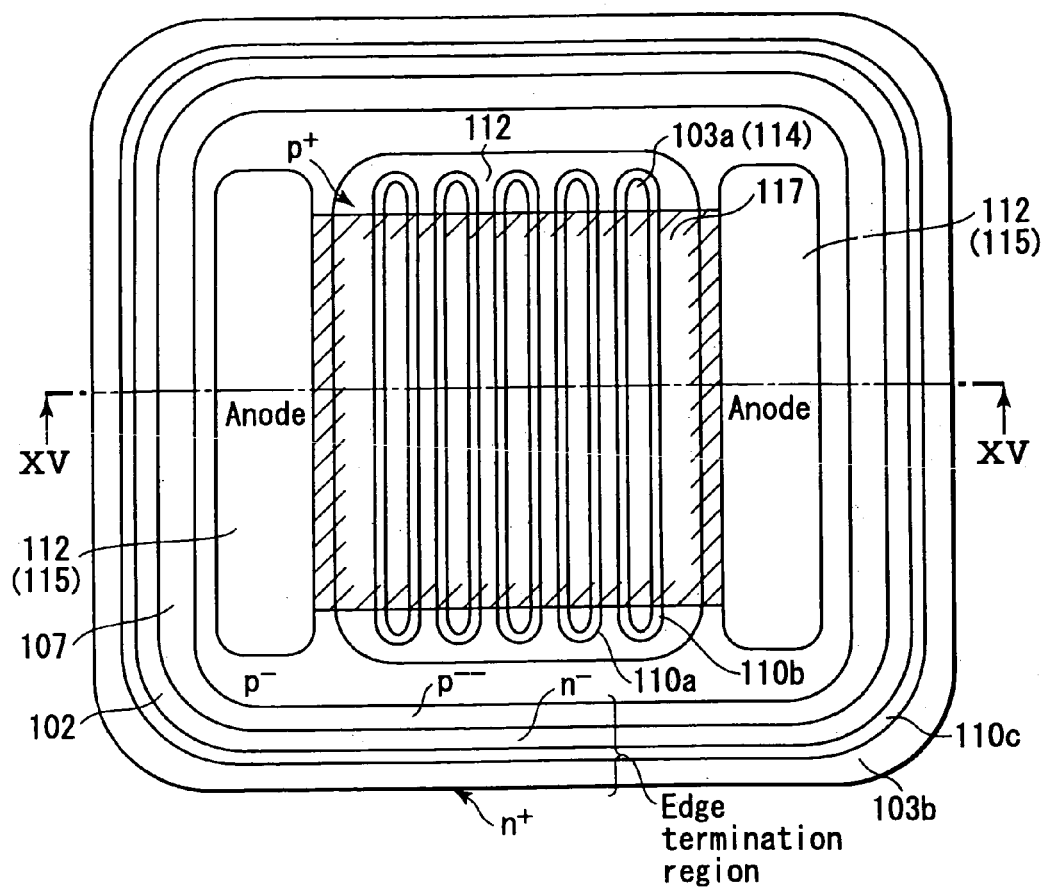
FIG. 16 is a top plan view of the high-breakdown-voltage semiconductor device according to the third embodiment, and FIG. 15 corresponds to a partial sectional view extending to the edge termination region from the vicinity of the element middle in the section along line XV—XV of FIG. 16.

As shown in FIGS. 15 and 16, trench portions 105 and 105' are disposed in the high-resistance semiconductor layer 102 in the periphery of the Schottky electrode 114. The width of the trench portion 105 is smaller than that of the trench portion 105'. The trench portion 105 is formed only in the element region, and the trench portion 105' is formed to extend over the element region and edge termination region. As shown in the top plan view of FIG. 16, the trench portions 105 and 105' are disposed in the form of the dug portions of the high-resistance semiconductor layer 102 around the Schottky junction region 103a. The Schottky junction regions 103a are disposed on the upper surfaces of a plurality of insular convex portions surrounded by the trench portions 105 and 105'. The trench portions 105 and 105' shown in FIG. 15 have widths, for example, of 1 µm and 100 µm, and the width of the insular convex portion between the trench portions 105 and 105' is, for example, 2 µm.

As control electrode layers, p-type first semiconductor regions (SiC layers) 109 are disposed in side surfaces 105a and 105b of the trench portion 105. The first semiconductor region 109 has an impurity concentration, for example, of $1 \times 10^{18}$ cm$^{-3}$. Examples of the p-type dopant for use include aluminum and boron. The first semiconductor regions 109 are also partially disposed in one side surface and bottom surface of the trench portion 105'.

The bottom surface corners of these first semiconductor regions 109 are formed to swell toward the high-resistance semiconductor layer 102. The first semiconductor region 109 has a maximum thickness, for example, of 0.3 µm in the bottom surfaces of the trench portions 105 and 105', and has a maximum thickness, for example, of 0.1 µm in the side surfaces 105a and 105b of the trench portion 105.

Moreover, sidewall insulating films 110a and 110b are selectively disposed in the first semiconductor regions 109 of the side surfaces 105a and 105b of the trench portion 105. As shown in FIG. 16, these sidewall insulating films 110a and 110b are formed to surround the outer peripheries of the plurality of insular convex portions. A sidewall insulating film 110c is also selectively disposed in the other side surface 105c of the trench portion 105'. As shown in FIG. 16, the sidewall insulating film 110c is formed along the inside of an outer peripheral portion 103b of the device.

Furthermore, a p-type second semiconductor region (SiC layer) 112 is selectively disposed as a contact region in the portion of the first semiconductor region 109 exposed from the sidewall insulating films (spacer layers) 110a and 110b in the bottom surface of the trench portion 105.

The contact region 112 is also disposed in the first semiconductor region 109 of the bottom surface of the trench portion 105'. This contact region 112 contacts the sidewall insulating film 110b only on one side. The contact region 112 has an impurity concentration, for example, of $1 \times 10^{20}$ cm$^{-3}$. Examples of the p-type dopant for use include aluminum and boron.

On the other hand, an n-type third semiconductor region (SiC layer) 101 is disposed as a cathode region on the other surface of the n-type high-resistance semiconductor layer 102. The cathode region 101 has an impurity concentration, for example, of $1 \times 10^{19}$ cm$^{-3}$. Examples of the n-type dopant include nitrogen, phosphor, and arsenic.

An anode electrode (Schottky electrode) 114, control electrode 115, and cathode electrode 116 are disposed on the surfaces of the Schottky junction region 103a, contact region 112, and cathode region 101, respectively. Furthermore, the anode electrode 114 and control electrode 115 are provided with an anode electrode lead wire 117 in order to short-circuit both the electrodes, and the cathode electrode 116 is provided with a cathode electrode lead wire 119. As shown in FIG. 16, the anode electrode lead wire 117 is formed as a broad-area connection electrode portion (peripherally hatched portion) for electrically connecting the control electrode 115 having a relative large area to each anode electrode 114.

Next, the edge termination region will be described. As shown in FIGS. 15 and 16, a RESURF layer 107 is disposed in contact with the first semiconductor region 109 in the outer periphery of the first semiconductor region 109 in the bottom surface of the trench portion 105'. The RESURF layer 107 has an impurity concentration, for example, of $3 \times 10^{17}$ cm$^{-3}$ and a depth of 0.6 µm. Examples of the p-type dopant for use include aluminum and boron.

The surface of a part of the high-resistance semiconductor layer 102 appears in the trench portion 105' bottom surface between the sidewall insulating film 110c and RESURF layer 107 positioned in the side surface 105c of the trench portion 105'. Moreover, the n-type semiconductor region 103b is disposed in the upper surface of the step in the outer periphery of the trench portion 105'. The n-type semiconductor region 103b has an impurity concentration, for example, of $1 \times 10^{19}$ cm$^{-3}$. Examples of the n-type dopant for use include nitrogen, phosphor, and arsenic. The above-described constituent elements form the edge termination structure.

One of the characteristics of the element structure of the present embodiment lies in that the anode electrode lead wire 117 is buried in the trench portions 105 and 105' via the sidewall insulating films 110a and 110b in the side surfaces 105a and 105b, and the contact region 112 and control electrode 115 are selectively disposed on the portion of the first semiconductor region 109 exposed from the sidewall insulating films 110a and 110b.

That is, the anode electrode lead wire 117 does not directly contact the first semiconductor regions 109 of the side surfaces 105a and 105b of the trench portions 105 and 105', and contacts the contact regions 112 of the bottom surfaces of the trench portions 105 and 105' only via the control electrode 115. The contact layers 112 or control electrodes 115 are formed with respect to the sidewall insulating films 110a and 10b in the self-aligning manner, and are therefore correctly positioned in the center regions of the bottom surfaces of the trench portions 105 and 105'.

By this configuration, the anode potential can selectively be applied to the bottom surfaces of the trench portions 105 and 105' via the anode electrode lead wire 117, and the anode potential is not directly applied to the first semiconductor regions 109 of the side surfaces 105a and 105b of the trench portions 105 and 105'.

Therefore, the anode voltage can preferentially be applied to the first semiconductor region 109 portions positioned adjacent to the corners of the bottom surfaces of the trench portions 105 and 105', so that the depletion layer can dominantly extend in the high-resistance semiconductor layer 102 disposed adjacent to the first semiconductor region 109 portion. The first semiconductor region 109 portion is formed in the swelling shape toward the high-resistance semiconductor layer 102. Therefore, the extension of the depletion layer in this portion is dominantly used to improve the leakage current property at the switch-off time.

For example, in the JBS of the present embodiment, when the breakdown voltage of 1500 V is designed, as compared with a related-art Schottky diode, a remarkable reduction of a leakage current at a reverse voltage application time can be anticipated, and trade-off of the leakage current and on resistance is improved. On the other hand, in the related-art trench JBS of such a type that the anode electrode lead wire directly contacts the first semiconductor region in the trench side surface, when the device is operated under the same conditions as described above, the effect of trade-off of the leakage current and on resistance is small.

Moreover, since the whole contact region 112 can be covered with the control electrode 115, the contact resistance can be reduced, a high current can be supplied at the switching time, and high-speed switching is possible.

Furthermore, according to the semiconductor device of the present embodiment, as shown in FIGS. 15 and 16, the RESURF layer 107 is disposed in contact with the first semiconductor region 109 in the outer periphery of the first semiconductor region 109 of the bottom surface of the trench portion 105', and therefore the high breakdown voltage of the element at the switch-off time can be obtained.

Especially, since the RESURF layer 107 is disposed together with the first semiconductor region 109 in the bottom surface of the trench portion 105', the first semiconductor region 109 surface and RESURF layer 107 surface can be positioned in the same plane. The electric field concentration in the corner of the first semiconductor region 109 can be minimized by the depletion layer by the RESURF layer 107, and then effect which contributes to the high breakdown voltage is large.

Moreover, it is possible to obtain the effect that the margin of the positional shift of the electrode formed on the channel stopper (n-type semiconductor region 103b) can be increased by the sidewall insulating film 110c formed in the side surface 105c of the trench portion 105'.

Next, a method of manufacturing the JBS of the present embodiment will be described with reference to FIGS. 17 to 24. These sectional views correspond to the sectional view along line XV—XV of FIG. 16.

Figure 17:
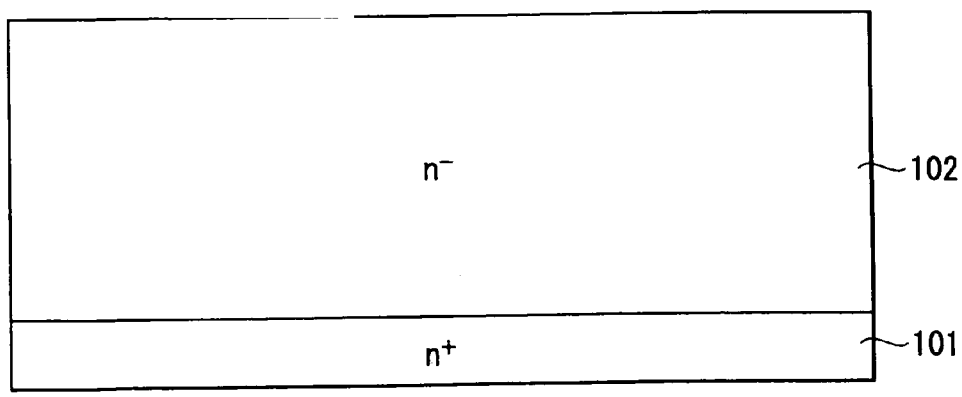
FIGS. 17 to 24 are sectional views showing the steps of the manufacturing process of the high-breakdown-voltage semiconductor device according to the third embodiment.

First, as shown in FIG. 17, the n-type high-resistance semiconductor layer (SiC layer) 102 is formed on the n-type heavily-doped substrate (SiC substrate) 101 by the epitaxial growth method. The n-type high-density substrate 101 corresponds to the n-type third semiconductor region (SiC layer) 101 which is the cathode layer.

Figure 18:
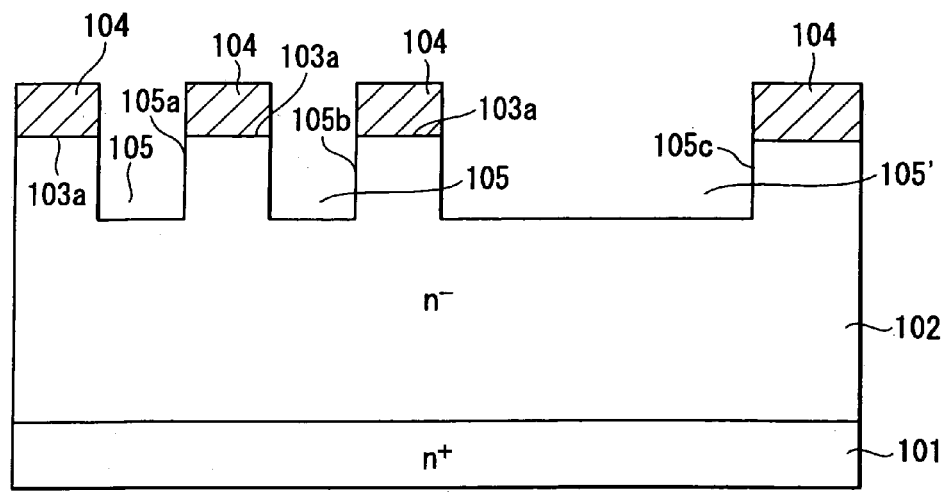

Next, as shown in FIG. 18, a mask pattern 104 is formed on the high-resistance semiconductor layer 102, and this mask pattern 104 is used to perform RIE. Thereby, the trench portions 105 and 105' are formed. The width of the trench portion 105 is formed to be smaller than that of the trench portion 105'. As the material of the mask pattern 104, the metals having the large resistance to etching, such as molybdenum, aluminum, and tungsten can be used. The fluorine-based gases such as $CF_4$ and $SF_6$ can be used as the etching gas. As a result of this etching step, the Schottky junction region 103a is formed.

Figure 19:
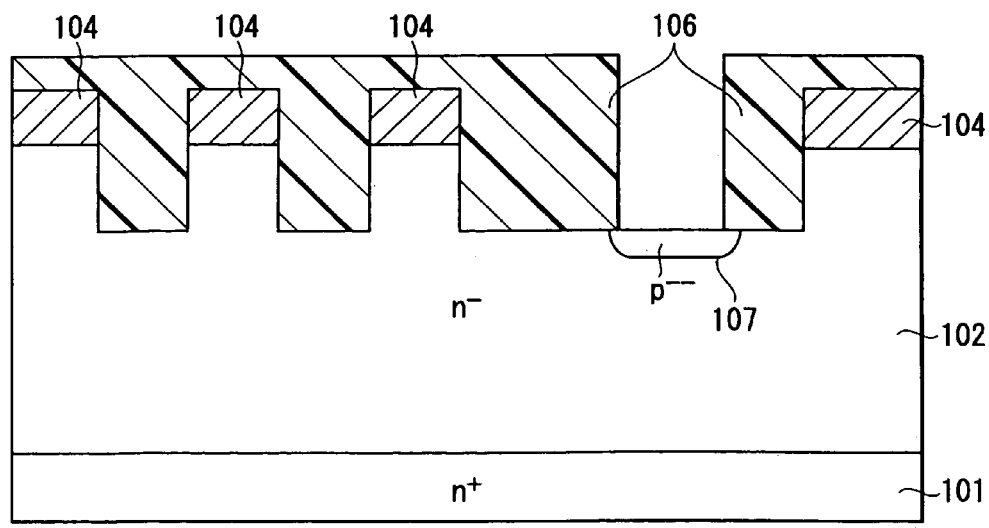

Next, as shown in FIG. 19, a resist pattern 106 is formed to extend over the trench portion 105 and expose a part of the bottom surface of the trench portion 105', and this resist pattern 106 is used as the mask to ion-implant the p-type impurities. The RESURF layer 107 is selectively formed in a part of the bottom of the trench portion 105' by the ion implantation.

Figure 20:
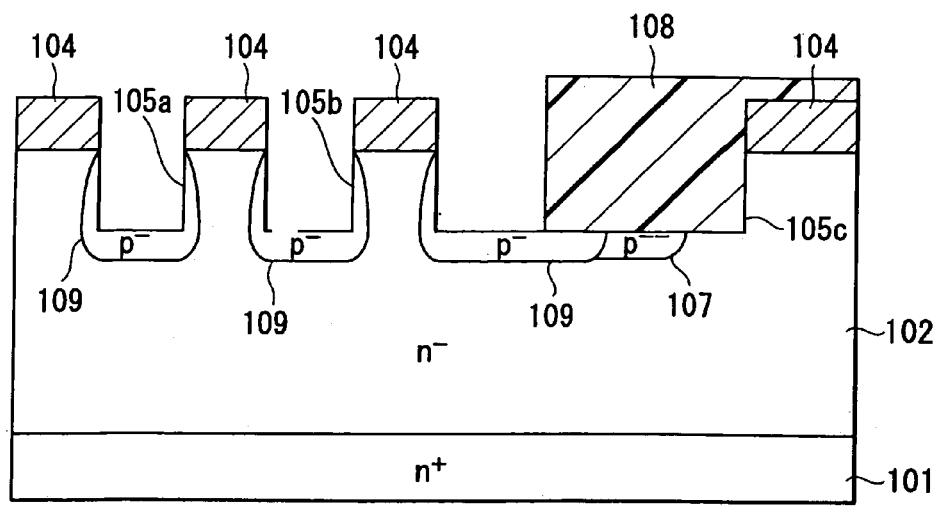
Figure 21:
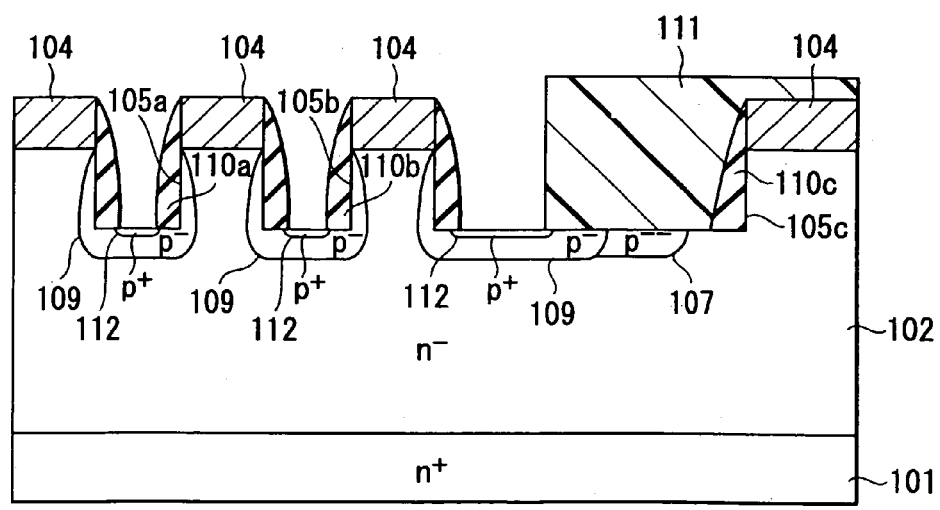

Next, as shown in FIG. 20, the mask pattern 104 is left while the resist pattern 106 is removed. A resist pattern 108 is newly formed to extend to the RESURF layer 107 over from the outermost peripheral portion of the substrate. This resist pattern 108 is used as the mask to ion-implant the p-type impurities. The p-type first semiconductor regions 109 are selectively formed in the side surfaces 105a and 105b and bottom surface of the trench portion 105 by the ion implantation. Additionally, the first semiconductor regions 109 are selectively formed in the portion disposed adjacent to the RESURF layer 107 of the trench portion 105' bottom surface and the side surface 105b.

In this case, when the first semiconductor region 109 is doped as heavily as possible, the function of the gate is improved. However, when the first semiconductor region 109 is formed in the vicinity of the Schottky junction region 103a, the breakdown voltage drops. Therefore, it is preferable to change the angle, dosage, and acceleration voltage of the ion implantation while the multiple ion implantation is performed, and to adjust or reduce the doping amount in the vicinity of the Schottky junction region 103a. By the above-described ion implantation step, the first semiconductor region 109 is formed so that the bottom surface corners of the region swell toward the high-resistance semiconductor layer 102.

Next, as shown in FIG. 20, the mask pattern 104 is left while the resist pattern 108 is removed. Furthermore, the continuous film formed of silicon nitride is formed over the whole surface including the trench portions 105 and 105' by the CVD method. The whole surface of the continuous film is anisotropically etched (RIE) to selectively leave the sidewall insulating films 110a, 10b, and 110c on the side surfaces 105a, 105b, and 105c of the trench portions 105 and 105'.

Thereafter, a resist pattern 111 is newly formed to extend to the first semiconductor region 109 disposed adjacent to the RESURF layer 107 from the outermost peripheral portion of the substrate. This resist pattern 111 is used as the mask to ion-implant the p-type impurities. The p-type contact layers 112 are selectively formed in the bottom surfaces of the trench portions 105 and 105' by the ion implantation.

Figure 22:
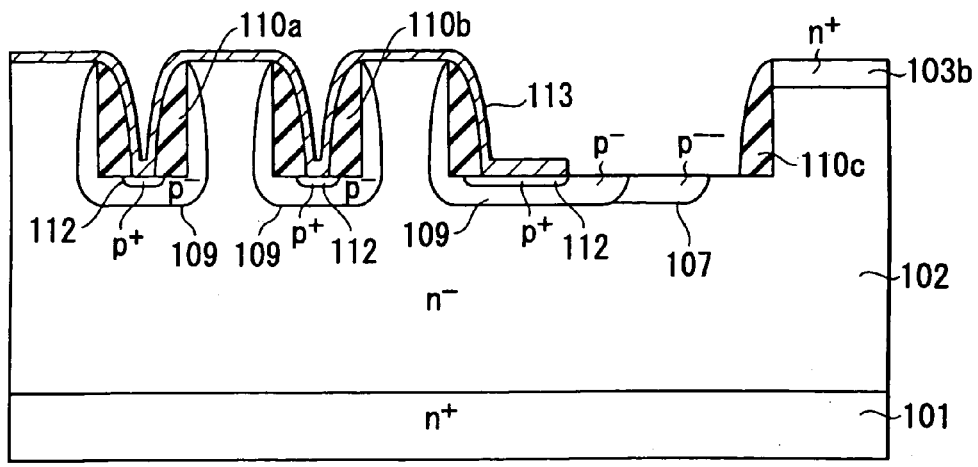

Next, as shown in FIG. 22, the mask pattern 104 and resist pattern 111 are removed. In this step, the surfaces of the sidewall insulating films 110a, 110b, and 110c extend backwards, and the upper ends of the sidewall insulating films 110a, 110b, and 110c substantially agree with the upper surfaces of the Schottky junction regions 103a.

It is to be noted that the n-type semiconductor region 103b may also be disposed in the outermost peripheral portion of the substrate by the ion implantation using the mask if necessary. The ion may selectively be implanted with respect to the edge termination region before forming the trench structure. In this case, it is not necessary to consider the mask alignment precision. Furthermore, for example, on the high-temperature condition at 1600° C., the first semiconductor region 109, contact region 112, and n-type semiconductor region 103b are annealed to be activated.

Thereafter, the resist mask (not shown) is formed to extend over the n-type semiconductor region 103b and the peripheral portion of the contact region 112, and the metal film formed of Ni is formed on the whole surface including the resist mask. Furthermore, the resist mask is removed, the lift-off method is performed, and the metal film is patterned to form a metal pattern 113 (FIG. 22).

Figure 23:
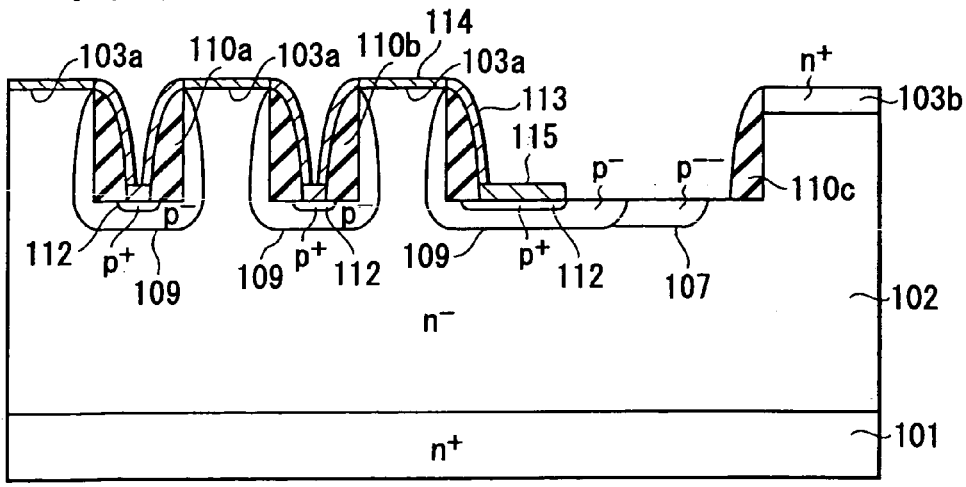

Thereafter, as shown in FIG. 23, the metal pattern 113 is annealed, for example, at 1000° C., and the silicidation reaction is allowed to proceed in the surfaces of the Schottky junction region 103a and contact region 112 to form the nickel silicide (e.g., Ni$_2$Si) layers 114 and 115 on the respective surfaces. In this silicidation process, the Schottky contact electrode (nickel silicide layer 114) and ohmic contact electrode (nickel silicide layer 115) can be formed in the Schottky junction region 103a and contact region 112 with one silicidation process.

Figure 24:
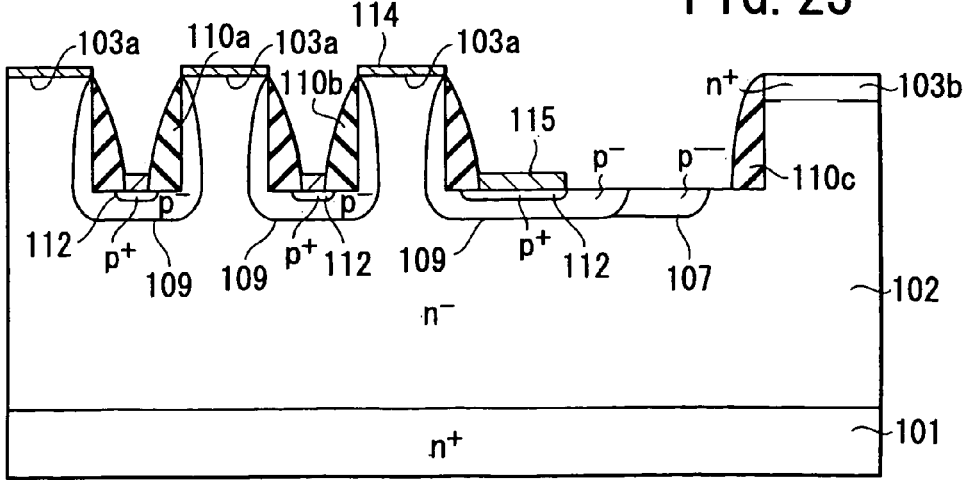

On the other hand, the silicidation reaction does not occur in the surfaces of the sidewall insulating films 110a and 110b, and a part of the metal pattern 113 remains in this portion. Furthermore, as shown in FIG. 24, the etchants such as the mixed solution (SC2) of hydrochloric acid and hydrogen peroxide are used to selectively etch/remove the remaining metal pattern 113. Thereby, the nickel silicide layers 114 and 115 are selectively left in the surfaces of the Schottky junction region 103a and contact region 112. The nickel silicide layers 114 and 115 form the anode electrode 114 and control electrode 115.

It is to be noted that the nickel silicide layer is selectively formed also on the surface of the n-type semiconductor region 103b so that the contact resistance of this portion can be reduced. In this case, in the above-described step, the metal pattern 113 may also be formed on the n-type semiconductor region 103b.

Next, the usual wiring step is carried out to form the cathode electrode 116 on the surface of the cathode region 101, further form the anode electrode lead wires 117 on the anode electrode 114 and control electrode 115, and form the cathode electrode lead wire 119 on the cathode electrode 116. Then, the JBS of the present embodiment shown in FIG. 15 is completed.

Fourth Embodiment

Figure 25:
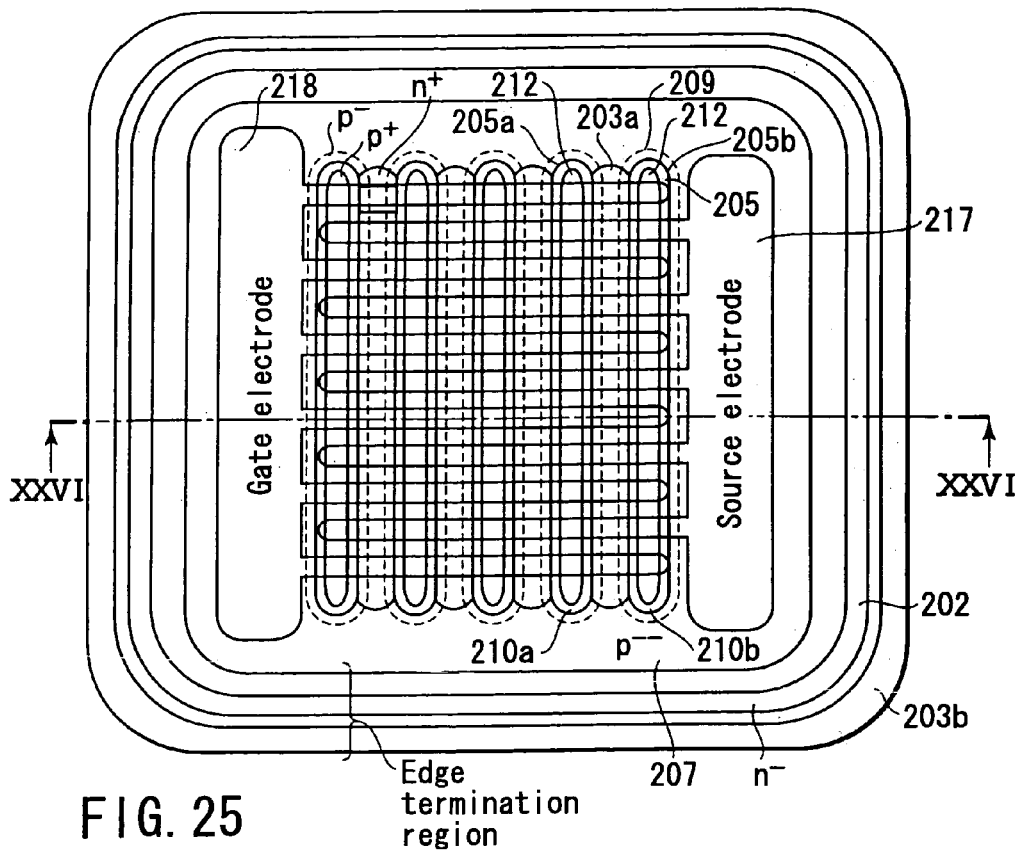
FIG. 25 is a top plan view showing a configuration of the high-breakdown-voltage semiconductor device (SIT) according to a fourth embodiment.
Figure 26:
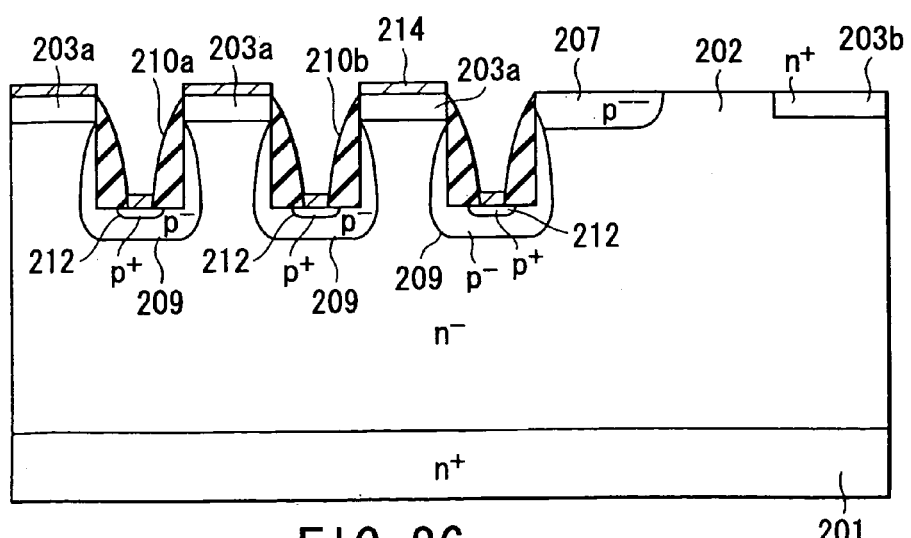
FIG. 26 is a partial sectional view extending to the edge termination region from the vicinity of the element middle in the section along line XXVI—XXVI of FIG. 25.

FIG. 25 is a top plan view of the high-breakdown-voltage semiconductor device (SIT) according to a fourth embodiment of the present invention. For the section along XXVI—XXVI line of FIG. 25, a partial sectional view extending to the edge termination region from the vicinity of the element middle is shown in FIG. 26, and is similar to FIG. 1 excluding the edge termination region.

As shown in FIG. 25, on one surface of an n-type high-resistance semiconductor layer (SiC layer) 202, a plurality of striped trench portions 205 are arranged in parallel with one another. In the surface of a high-resistance semiconductor layer 202 between the trench portions 205, n-type first semiconductor region (SiC layer) 203a having a resistance lower than that of the high-resistance semiconductor layer 202 is disposed as a source region. The width of the trench portion 205 and the width of the source region 203a between the trench portions 205 shown in FIG. 26 are similar to those of the first embodiment.

In the side surfaces (205a and 205b) and bottom surface of each trench portion 205, p-type second semiconductor regions (SiC layers) 209 are disposed as gate regions. The bottom surface corners of each gate region 209 are formed so as to swell toward the high-resistance semiconductor layer 202. The maximum thicknesses in the side and bottom surfaces of the gate region 209 are similar to those of the first embodiment.

Moreover, sidewall insulating films (spacer layers) 210a and 210b are selectively disposed in the gate layers 209 of the side surfaces 205a and 205b of the trench portion 205. In the portions of the gate region 209 exposed from the sidewall insulating films 210a and 210b, p-type third semiconductor regions (SiC layers) 212 are selectively disposed as gate contact regions.

On the other hand, as shown in FIG. 26, an n-type fourth semiconductor region (SiC layer) 201 is disposed as a drain region in the other surface of the n-type high-resistance semiconductor layer 202.

The source, gate, and drain electrodes are disposed on the surfaces of the source region 203a, gate contact region 212, and drain region, respectively. Furthermore, a source electrode lead wire 217, gate electrode lead wire 218, and drain electrode lead wire (not shown) are disposed in these source, gate, and drain electrodes, respectively.

As shown in FIG. 25, the source electrode lead wire 217 is formed of a large-area electrode pad portion, and a plurality of striped connection electrode portions for electrically connecting the electrode pad portion to each source electrode, and has a comb-teeth-shaped pattern. The gate electrode lead wire 218 is similarly formed of the large-area electrode pad portion and a plurality of striped connection electrode portions for electrically connecting the electrode pad portion to the gate electrode, and has the comb-teeth-shaped pattern. These source electrode lead wire 217 and gate electrode lead wire 218 are laid so as to mesh with each other. This structure can be realized by the contact structure shown in FIG. 4.

It is to be noted that for the edge termination region, as shown in FIGS. 25 and 26, a RESURF layer 207 is disposed in contact with the surface region of the high-resistance semiconductor layer 202 including the trench structure, and an n-type semiconductor region 203b is disposed in the outermost peripheral portion of the substrate. The surface of a part of the high-resistance semiconductor layer 202 appears between the RESURF layer 207 and the n-type semiconductor region 203b. The above-described constituting elements form the edge termination structure.

The effect similar to that of the first embodiment can be obtained even by the SIT of the present embodiment described above. Additionally, it is also possible to obtain an effect that the edge termination region is more easily formed.

It is to be noted that the fourth embodiment has been described as the modification of the first embodiment, but the edge termination region of the fourth embodiment can also be applied to that of the high-breakdown-voltage semiconductor device according to the second and third embodiments.

Fifth Embodiment

Figure 27:
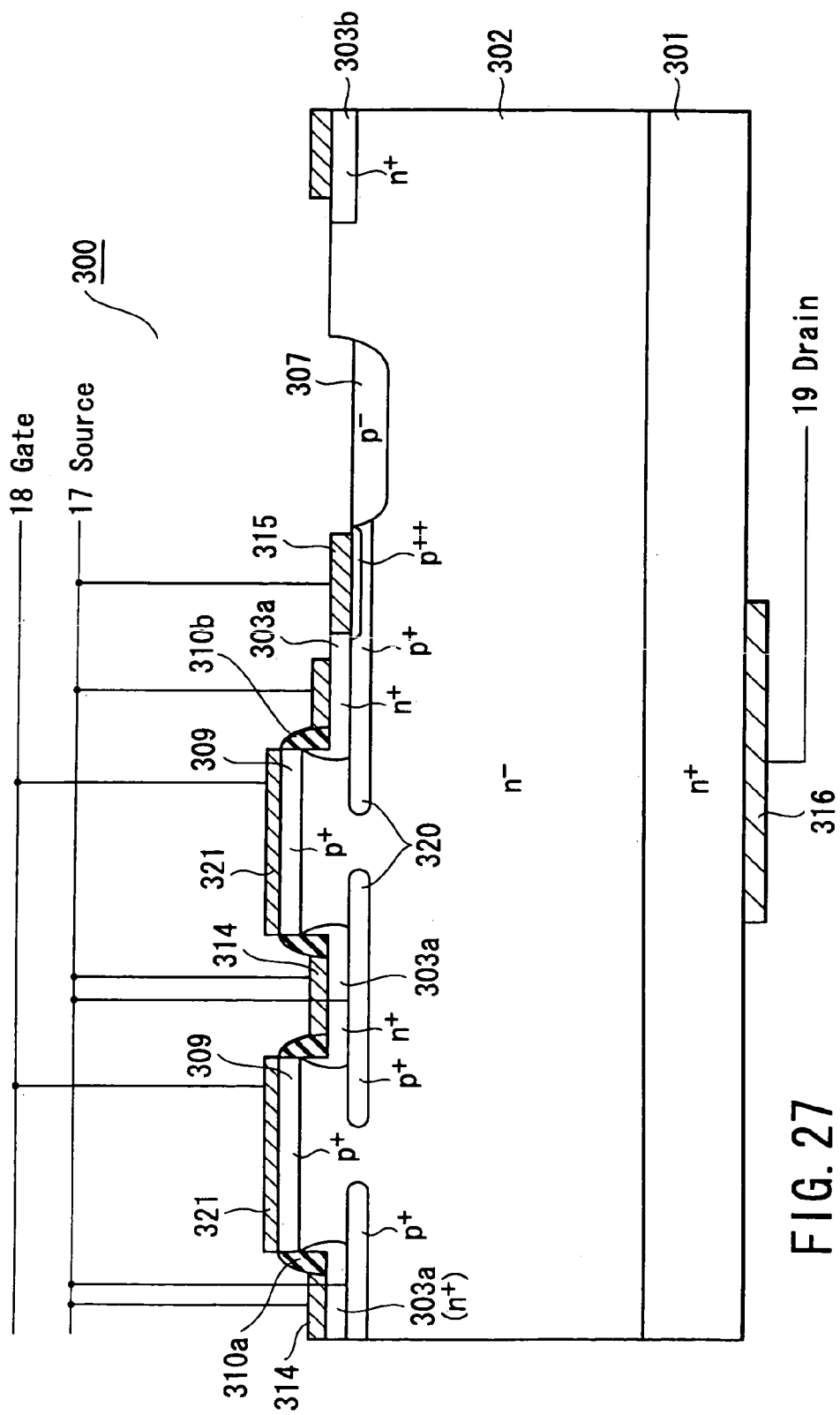
FIG. 27 is a schematic partial sectional view showing the configuration of the high-breakdown-voltage semiconductor device (SIT) according to a fifth embodiment.

FIG. 27 is a schematic partial sectional view of the high-breakdown-voltage semiconductor device (SIT) according to a fifth embodiment.

The SIT of the fifth embodiment is different from that of the first embodiment in that gate layers (p+ layers) 309 are formed on the convex portions, and source layers 303a are formed in the bottom portion of the trenches. Since a top plan view is similar to FIG. 2 of the first embodiment, FIG. 2 is also applied to this embodiment as a schematic plan view.

In this embodiment, the channel is narrowed by the gate layers 309 and p+-type buried layers 320. In this case, the channel is formed in a path extending to an n+-type drain layer 301 from an n+-type source layer 303a between the p+-type buried layers 320 disposed adjacent to each other. When a reverse bias is applied between the gate layer 309 and source layer 303a, the depletion layer extending from the gate layer 309 narrows the above-described channel.

The structural characteristic and effect of the SIT of the present embodiment will be described in more detail. As shown in FIG. 27, on one surface (back surface) of the n-type high-resistance semiconductor layer (SiC layer) 302, a low-resistance n+-type semiconductor layer 301 is disposed as the drain layer. Reference numeral 316 denotes a drain electrode (fourth electrode), and 319 denotes a drain electrode lead wire.

The impurity concentration and thickness of the high-resistance semiconductor layer 302 are determined by the designed breakdown voltage. For example, the impurity concentration is in a range of $1 \times 10^{14}$ to $1 \times 10^{16}$ cm$^{-3}$ and the thickness is in a range of 5 to 100 µm. The drain layer has an impurity concentration, for example, of $1 \times 10^{19}$ cm$^{-3}$. Examples of the n-type dopant for use include nitrogen, phosphor, and arsenic.

On the other surface (front surface) of the n-type high-resistance semiconductor layer 302, the heavily-doped p+-type buried layer 320 short-circuited with the source layer 303a (source electrode (second electrode) 314) is partially formed, and connected to an edge termination structure (RESURF layer) 307 at the edge termination region. The impurity concentration of the p+-type buried layer 320 is, for example, $2 \times 10^{18}$ cm$^{-3}$. In order to form an ohmic contact in a contact portion of the p+-type buried layer 320 with the (third) electrode 315, further a p++-type layer having a high concentration of $1 \times 10^{20}$ cm$^{-3}$ or more is formed. The p+-type buried layer 320 in the central region is connected to the source lead wire 17 via a heavily-doped contact layer (through not shown), etc., formed in an opening provided in the source layer 303a.

The heavily-doped p+-type gate layer 309 in contact with a gate electrode (first electrode) 321 is formed on the convex portion of the upper portion of the p+-type buried layer 320. The gate layer 309 has an impurity concentration, for example, of $2 \times 10^{18}$ cm$^{-3}$. The concentration of the n-type layer under the gate layer 309 has a concentration, for example, of $2 \times 10^{16}$ cm$^{-3}$. In order to form the ohmic contact in the portion of the gate layer 309 which directly contacts the gate electrode 321, a layer (not shown) having a high concentration of $1 \times 10^{20}$ cm$^{-3}$ or more is formed. Examples of the p-type dopant for use include Al and boron (B).

A source layer 301a has a concentration, for example, of $2 \times 10^{19}$ cm$^{-3}$. In order to form the ohmic contact in the contact portion with the source electrode 314, a layer (not shown) having a high concentration of $1 \times 10^{20}$ cm$^{-3}$ or more is formed.

The edge termination structure (RESURF layer) 307 is a p−-type lightly-doped layer, and has an impurity concentration, for example, of $3 \times 10^{17}$ cm$^{-3}$ and a depth of 0.6 µm.

The characteristic of the present embodiment lies in that the gate electrode 321 and source electrode 314 are formed in a self-aligning manner. Therefore, the useless region for allowing the mask shift is unnecessary, and the resistance value per area can be inhibited from being increased by the useless region. Moreover, since the gate electrode 321 is in the upper portion of the heavily-doped p+-type buried layer 320, the capacity between gate and drain is small, and the high-speed operation is possible. Moreover, when an element 300 of FIG. 27 is used instead of the element 20 in the cascode connection circuit shown in FIG. 14, with the drain electrode connecting to the collector side and with the source electrode connecting to the emitter side, the circuit can be operated as the normally off switch element from the outside in the same manner as in the usual MOSFET.

Sixth Embodiment

Figure 28:
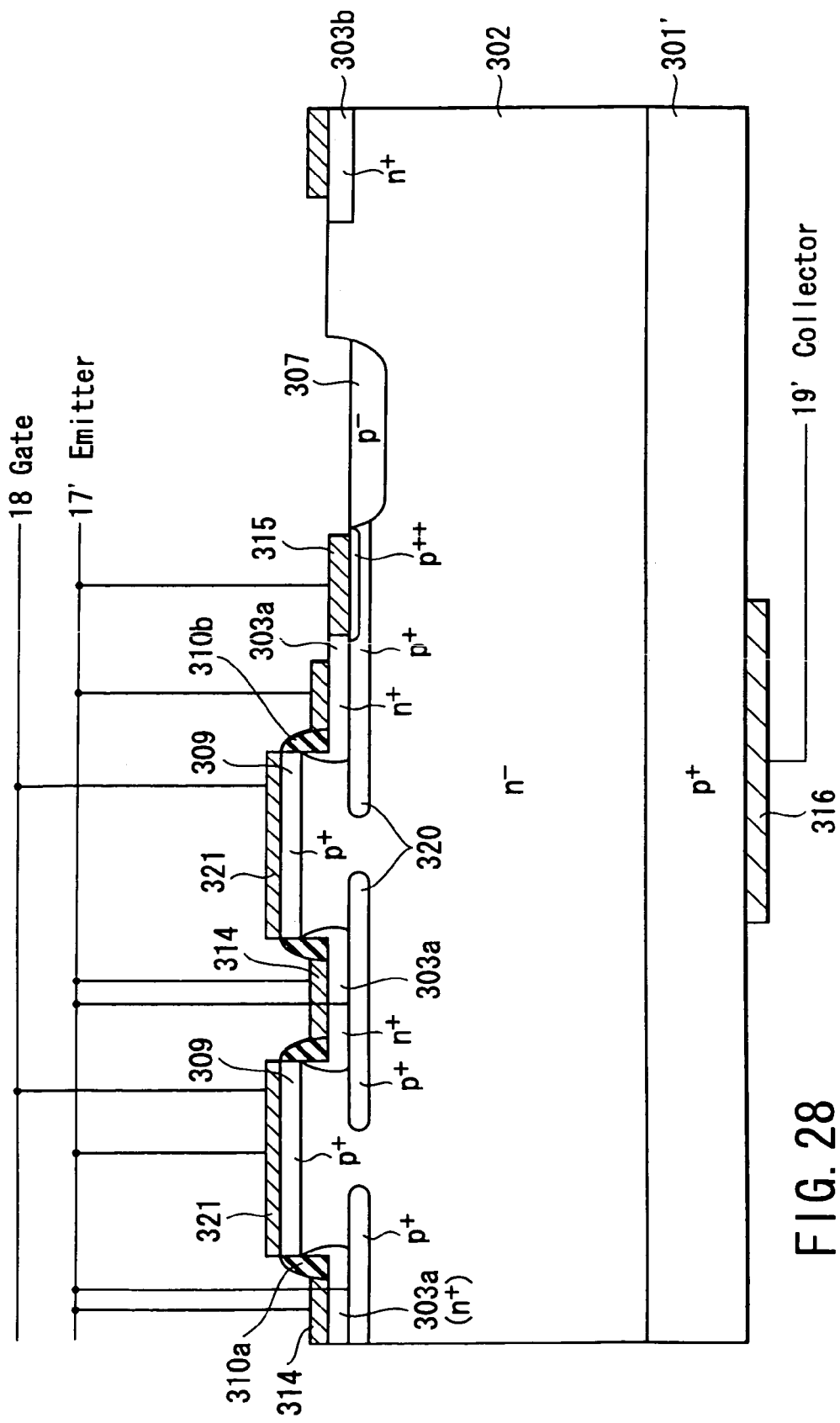
FIG. 28 is a schematic partial sectional view showing the configuration of the high-breakdown-voltage semiconductor device (SI thyristor) according to a sixth embodiment.

For the high-breakdown-voltage semiconductor device of a sixth embodiment, as shown in FIG. 28, the semiconductor layer 301 of the back surface of the fifth embodiment (FIG. 27) is changed to the p-type from the n-type, and the SI thyristor is formed. The top plan view is similar to FIG. 2 and is therefore omitted.

First, the structural characteristic and effect of the SI thyristor of the present embodiment will be described. As shown in FIG. 28, on one surface (back surface) of the n-type high-resistance semiconductor layer (SiC layer) 302, a low-resistance p+-type semiconductor layer 301' is disposed as the collector layer. Reference numeral 316 denotes the collector electrode (fourth electrode), and 19' denotes the collector electrode lead wire.

The impurity concentration and thickness of the high-resistance semiconductor layer 302 are determined by the designed breakdown voltage. For example, the impurity concentration is in a range of $1 \times 10^{14}$ to $1 \times 10^{16}$ cm$^{-3}$ and the thickness is in a range of 5 to 100 µm. The collector layer 301' has an impurity concentration, for example, of $1 \times 10^{19}$ cm$^{-3}$. Examples of the n-type dopant for use include nitrogen, phosphor, and arsenic.

On the other surface (front surface) of the n-type high-resistance semiconductor layer 302, the heavily-doped p+-type buried layer 320 short-circuited with the emitter layer 303a (emitter electrode (second electrode) 314) is partially formed, and connected to an edge termination structure (RESURF layer) 307 at the edge termination region. The impurity concentration of the p+-type buried layer 320 is, for example, $2 \times 10^{18}$ cm$^{-3}$. In order to form an ohmic contact in a contact portion of the p+-type buried layer 320 with the (third) electrode 315, further a p++-type layer having a high concentration of $1 \times 10^{20}$ cm$^{-3}$ or more is formed. The p+-type buried layer 320 in the central region is connected to the emitter lead wire 17' via a heavily-doped contact layer, etc., formed in an opening provided in the emitter layer 303a.

The heavily-doped p+-type gate layer 309 in contact with the gate electrode (first electrode) 321 is formed on the convex portion of the upper portion of the p+-type buried layer 320. The gate layer 309 has an impurity concentration, for example, of $2 \times 10^{18}$ cm$^{-3}$. The impurity concentration of the n-type layer under the gate layer 309 has a concentration, for example, of $2 \times 10^{16}$ cm$^{-3}$. In order to form the ohmic contact in the portion of the gate layer 309 which directly contacts the gate electrode 321, the layer (not shown) having a high concentration of $1 \times 10^{20}$ cm$^{-3}$ or more is formed. Examples of the p-type dopant for use include Al and boron (B).

The emitter layer 301a has a concentration, for example, of $2 \times 10^{19}$ cm$^{-3}$. In order to form the ohmic contact in the contact portion with the emitter electrode (second electrode) 314, the layer (not shown) having a high concentration of $1 \times 10^{20}$ cm$^{-3}$ or more is formed.

The edge termination structure (RESURF layer) 307 is the p−-type lightly-doped layer, and has an impurity concentration, for example, of $3 \times 10^{17}$ cm$^{-3}$ and a depth of 0.6 μm.

The characteristic of the present embodiment lies in that the gate electrode and emitter electrode are formed in the self-aligning manner. Therefore, the useless region for allowing the mask shift is unnecessary, and the resistance value per area can be inhibited from being increased by the useless region. Moreover, since the gate layer 309 is in the upper portion of the p+-type buried layer 320, the capacity between gate and collector is small, and the high-speed operation is possible. Moreover, when the element of FIG. 28 is used instead of the element 20 in the cascode connection circuit shown in FIG. 14, the circuit can be operated as the normally off switch element from the outside in the same manner as in the usual MOSFET.

Seventh Embodiment

Figure 29:
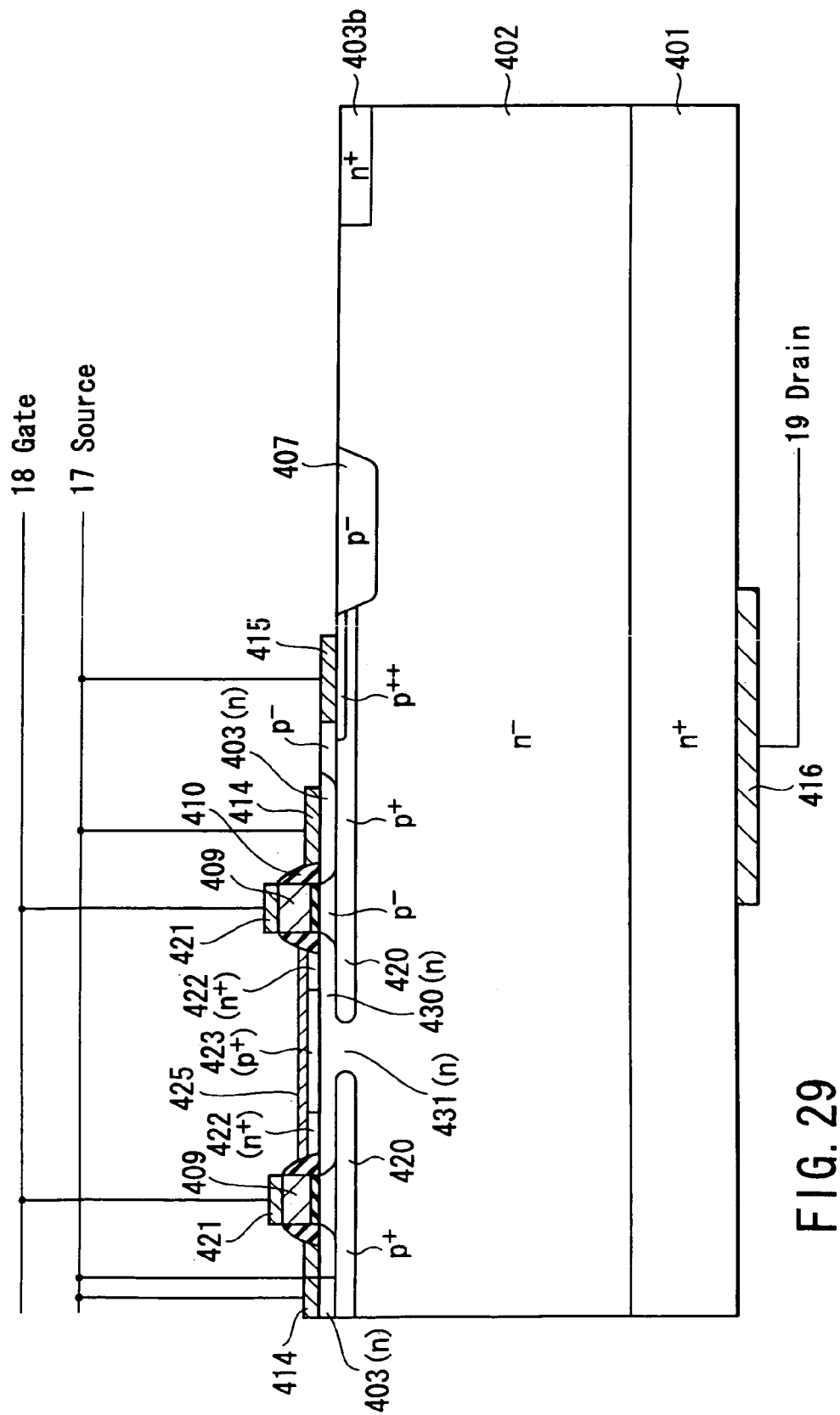
FIG. 29 is a schematic partial sectional view showing the configuration of the high-breakdown-voltage semiconductor device (MOSFET) according to a seventh embodiment.

FIG. 29 is a partial sectional view of the high-breakdown-voltage semiconductor device (MOSFET) according to a seventh embodiment. The MOSFET of the present embodiment has a buried layer structure similar to that of the SIT of the fifth embodiment, and can easily be formed on the same substrate as that of the SIT.

First, the structural characteristic and effect in the high-breakdown-voltage semiconductor switching element of the present embodiment will be described. As shown in FIG. 29, on one surface (back surface) of the n-type high-resistance semiconductor layer (SiC layer) 402, a low-resistance n+-type semiconductor layer 401 is disposed as the drain layer. Reference numeral 416 denotes the drain electrode, and 19 denotes the drain electrode lead wire.

The impurity concentration and thickness of the high-resistance semiconductor layer 402 are determined by the designed breakdown voltage. For example, the impurity concentration is in a range of $1 \times 10^{14}$ to $1 \times 10^{16}$ cm$^{-3}$ and the thickness is in a range of 5 to 100 μm. The drain layer 401 has an impurity concentration, for example, of $1 \times 10^{19}$ cm$^{-3}$. Examples of the n-type dopant for use include nitrogen, phosphor, and arsenic.

On the other surface (front surface) of the n-type high-resistance semiconductor layer 402, the heavily-doped p+-type buried layer 420 short-circuited with the source layer 403 (source electrode 414) is partially formed, and connected to an edge termination structure (RESURF layer) 407 at the edge termination region. The impurity concentration of the p+-type buried layer 420 is, for example, $2 \times 10^{18}$ cm$^{-3}$. In order to form an ohmic contact in a contact portion of the p+-type buried layer 420 with the electrode 415, further a p++-type layer having a high concentration of $1 \times 10^{20}$ cm$^{-3}$ or more is formed. The p+-type buried layer 420 in the central region is connected to the source lead wire 17 via a heavily-doped contact layer, etc., formed in an opening provided in the source layer 403.

A lightly-doped p−-type layer is formed adjacent to the n-type source layer 403 in the upper portion of the p+-type buried layer 420. Gate electrodes 409, for example, by polysilicon are formed in an insulating manner in the upper portion of the lightly-doped p−-type layer. An n-type layer 430 is formed on the side of the gate electrode 409 opposite to the source layer 403, and is connected to an n-type region 431 between the p+-type buried layers 420 disposed adjacent to each other.

A heavily-doped p+-type layer 423 is formed in the upper portion of the n-type region 431, and is short-circuited with an adjacent n+-type layer 422 by a short-circuit electrode 425. An upper electrode 421 of the gate electrode 409, source electrode 414, and short-circuit electrode 425 are formed in the self-aligning manner using sidewall insulating film 410.

The p−-type layer under the gate electrode 409 has a concentration, for example, of $1 \times 10^{17}$ cm$^{-3}$. The impurity concentration of the p+-type layer 423 on a drain electrode side is, for example, $2 \times 10^{18}$ cm$^{-3}$. In order to form the ohmic contact in the portion which directly contacts the short-circuit electrode 425, the layer having a high concentration of $1 \times 10^{20}$ cm$^{-3}$ or more is formed. Examples of the p-type dopant for use is Al and boron (B).

The impurity concentration of the n-type source layer 403 is, for example, $2 \times 10^{19}$ cm$^{-3}$. In order to form the ohmic contact in the contact portion of the source layer 403 with the source electrode 414, the layer having a high concentration of $1 \times 10^{20}$ cm$^{-3}$ or more is formed.

The impurity concentration of the n+-type layer 430 on the drain side of the gate electrode 409 is, for example, $2 \times 10^{16}$ cm$^{-3}$. For the impurity concentration of the n+-type layer 422 of the portion which contacts the short-circuit electrode 425, the layer having a high concentration of $1 \times 10^{20}$ cm$^{-3}$ or more is formed. The edge termination region 407 is a p−-type lightly-doped layer, and has an impurity concentration, for example, of $3 \times 10^{17}$ cm$^{-3}$, and a depth of 0.6 μm.

The characteristic of the present embodiment lies in that the gate electrode 421 and source electrode 414 are formed in the self-aligning manner, and the switching is controlled by the MOS gate. The useless region for allowing the mask shift is unnecessary by a self-aligning process, and the resistance value per area can be inhibited from being increased by the useless region. Since the switching is controlled by the MOS gate, the circuit can be operated as the normally off switch element in the same manner as in the usual MOSFET without forming any external circuit.

Moreover, at the reverse voltage application time, the voltage is not applied to the MOSFET portion, and is applied to the pn junction formed by the p$^+$-type buried layer 420 and n$^-$type high-resistance semiconductor layer 402. Therefore, the breakdown voltage and resistance of the MOSFET portion can be lowered. In the single SiC-MOSFET, the resistance of the MOSFET portion is high, but this structure can realize the element which has a low resistance and high breakdown voltage.

In more detail, when the MOSFET is off (e.g., the gate or source voltage indicates 0 V, and drain voltage indicates 1000 V), the leakage current flows toward the source electrode from the drain electrode via the n-type layers or regions 401, 402, 431, 430. At this time, the voltage drops in the n-type regions 431, 430, and the reverse bias is applied between the regions 431, 430 and the p$^+$-type buried layer 420 indicating 0 V. Thereby, the depletion layer extends from the p$^+$-type buried layer 420 up to the depletion layer on the side of the p$^+$-type layer 423 and pinches off the path of the leakage current. Therefore, the high voltage applied between the drain and source is applied to the above-described pn junction, and the MOSFET portion is protected from the high voltage.

Eighth Embodiment

Figure 30:
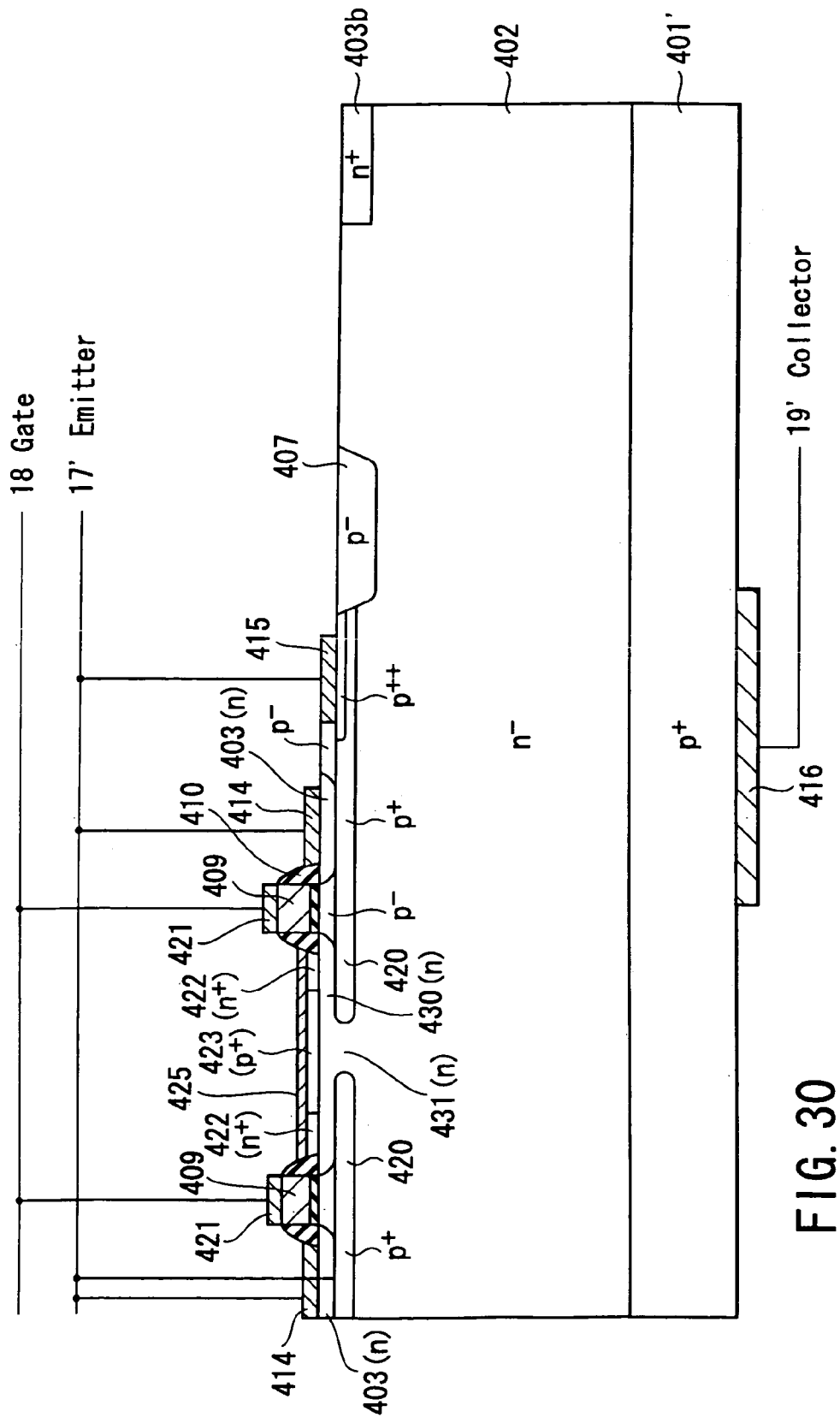
FIG. 30 is a schematic partial sectional view showing the configuration of the high-breakdown-voltage semiconductor device (IGBT) according to an eighth embodiment.

For the high-breakdown-voltage semiconductor device of an eighth embodiment, as shown in FIG. 30, the semiconductor layer 401 of the back surface of the seventh embodiment (FIG. 29) is changed to the p-type from the n-type, and an insulated gate bipolar transistor (IGBT) is formed.

First, the structural characteristic and effect in the high-breakdown-voltage semiconductor switching device of the present embodiment will be described. As shown in FIG. 29, on one surface (back surface) of the n-type high-resistance semiconductor layer (SiC layer) 402, a low-resistance p$^-$-type semiconductor layer 401' is disposed as the collector layer. Reference numeral 416 denotes the collector electrode, and 19' denotes the collector electrode lead wire.

The impurity concentration and thickness of the high-resistance semiconductor layer 402 are determined by the designed breakdown voltage. For example, the impurity concentration is in a range of $1\times10^{14}$ to $1\times10^{16}$ cm$^{-3}$ and the thickness is in a range of 5 to 100 μm. The collector layer 401' has an impurity concentration, for example, of $1\times10^{19}$ cm$^{-3}$. Examples of the n-type dopant for use include nitrogen, phosphor, and arsenic.

On the other surface (front surface) of the n-type high-resistance semiconductor layer 402, the heavily-doped p$^+$-type buried layer 420 short-circuited with the emitter layer 403 (emitter electrode 414) is partially formed, and connected to an edge termination structure (RESURF layer) 407 at the edge termination region. The impurity concentration of the p$^+$-type buried layer 420 is, for example, $2\times10^{18}$ cm$^{-3}$. In order to form an ohmic contact in a contact portion of the p$^+$-type buried layer 420 with the electrode 415, further a p$^{++}$-type layer having a high concentration of $1\times10^{20}$ cm$^{-3}$ or more is formed. The p$^+$-type buried layer 420 in the central region is connected to the emitter lead wire 17' via a heavily-doped contact layer, etc., formed in an opening provided in the emitter layer 403.

The lightly-doped p$^-$-type layer is formed adjacent to the n-type source layer 403 in the upper portion of the p$^+$-type buried layer 420. The gate electrodes 409, for example, by polysilicon are formed in the insulating manner in the upper portion of the lightly-doped p$^-$-type layer. The n-type layer 430 is formed on the side of the gate electrode 409 opposite to the source layer 403, and is connected to the n-type region 431 between the p$^+$-type buried layers 420 disposed adjacent to each other.

The heavily-doped p$^+$-type layer 423 is formed in the upper portion of the n-type region 431, and is short-circuited with the adjacent n$^+$-type layer 422 by the short-circuit electrode 425. The upper electrode 421 of the gate electrode 409, emitter electrode 414, and short-circuit electrode 425 are formed in the self-aligning manner using the sidewall insulating film 410.

The p$^-$-type layer under the gate electrode 409 has a concentration, for example, of $1\times10^{17}$ cm$^{-3}$. The impurity concentration of the p$^+$-type layer 423 on a collector electrode side is, for example, $2\times10^{18}$ cm$^{-3}$. In order to form the ohmic contact in the portion which directly contacts the short-circuit electrode 425, the layer having a high concentration of $1\times10^{20}$ cm$^{-3}$ or more is formed. Examples of the p-type dopant for use is Al and boron (B).

The impurity concentration of the n-type emitter layer 403 is, for example, $2\times10^{19}$ cm$^{-3}$. In order to form the ohmic contact in the contact portion of the emitter layer 403 with the emitter electrode 414, the layer having a high concentration of $1\times10^{20}$ cm$^{-3}$ or more is formed.

The impurity concentration of the n-type layer 430 on the collector side of the gate electrode 409 is, for example, $2\times10^{16}$ cm$^{-3}$. For the impurity concentration of the n$^+$-type layer 422 of the portion which contacts the short-circuit electrode 425, the layer having a high concentration of $1\times10^{20}$ cm$^{-3}$ or more is formed. The edge termination region 407 is a p$^-$-type lightly-doped layer, and has an impurity concentration, for example, of $3\times10^{17}$ cm$^{-3}$, and a depth of 0.6 μm.

The characteristic of the present embodiment lies in that the gate electrode and emitter electrode are formed in the self-aligning manner, and the switching is controlled by the MOS gate. The useless region for allowing the mask shift is unnecessary by the self-aligning process, and the resistance value per area can be inhibited from being increased by the useless region. Since the switching is controlled by the MOS gate, the circuit can be operated as the normally off switch element in the same manner as in usual IGBT without forming any external circuit.

Moreover, at the reverse voltage application time, the voltage is not applied to the MOSFET portion, and is applied to the pn junction formed by the p$^+$-type buried layer 420 and n$^-$type high-resistance semiconductor layer 402. Therefore, the breakdown voltage and resistance of the MOSFET portion can be lowered. In the single SiC-IGBT, the resistance of the MOSFET portion is high, but this structure can realize the element which has a low resistance and high breakdown voltage.

In more detail, when the MOSFET is off (e.g., the gate or source voltage indicates 0 V, and drain voltage indicates 1000V), the leakage current flows toward the source electrode from the drain electrode via the n-type layers or regions 401, 402, 431, 430. At this time, the voltage drops in the n-type regions 431, 430, and the reverse bias is applied between the regions 431, 430 and the p$^+$-type buried layer 420 indicating 0V. Thereby, the depletion layer extends from the p$^+$-type buried layer 420 up to the depletion layer on the side of the p$^+$-type layer 423, and pinches off the path of the leakage current. Therefore, the high voltage applied between the drain and source is applied to the above-described pn junction, and the MOSFET portion is protected from the high voltage.

It is to be noted that the SiC layer has been described as the example of the semiconductor layer in the above-described embodiments, but there are many multiple-forms in the crystal form of SiC, and a crystal form referred to as 4H—SiC is preferably used. Additionally, a crystal form referred to as 3C—SiC may also be used. Furthermore, crystal forms referred to as 2H—SiC and 6H—SiC may also be used. Moreover, a plane referred to as (0001) plane is used in forming the element, but crystal orientation planes such as (112-0) can also be used. Furthermore, the present invention produces a great effect, especially when the SiC layer is used as the semiconductor layer, but the present invention can also be applied to semiconductor such as IV-group semiconductor (Si, SiGe) and III–V group semiconductor (GaAs, GaN). Moreover, the conductive type pn may also be reversed.

Moreover, in the above-described embodiments, the RESURF layer is used as the edge termination structure, but other edge termination regions such as a guard ring structure may also be used. Furthermore, for SiC, examples of the metal layer for making the ohmic contact, other than the above-described embodiments, include cobalt and aluminum. Examples of the metal layer for making the Schottky contact, other than the above-described embodiments, include nickel, molybdenum, nickel silicide, cobalt, cobalt silicide, and gold.

Furthermore, the high-resistance semiconductor layer is disposed on the substrate which contains the impurities of one conductive type in high concentration, but the layer is not limited to this layer, and it is also possible to form the semiconductor layer which contains the impurities of one conductive type in high concentration on one surface of the high-resistance semiconductor substrate by the ion implantation or epitaxial growth.

As described above, according to the present invention, there can be provided a low-on-resistance high-breakdown-voltage semiconductor device which is superior in switch-off properties.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-breakdown-voltage semiconductor device comprising:
a high-resistance semiconductor layer of a first conductivity type having a first main surface and a second main surface, a plurality of first trenches being formed on the first main surface of the high-resistance semiconductor layer in a longitudinal plane shape and arranged in parallel with each other;
a first electrode formed on each of surface regions of the first main surface of the high-resistance semiconductor layer to form a Schottky junction therewith, each of the surface regions being sandwiched between adjacent trenches of the plurality of first trenches;
a first semiconductor region of a second conductivity type continuously disposed in a sidewall and a bottom portion of each of the plurality of first trenches;
a sidewall insulating film disposed on the first semiconductor region of the sidewall of each of the plurality of first trenches;
a second semiconductor region of the second conductivity type disposed in a surface region of the first semiconductor region of the bottom portion of each of the plurality of first trenches and having an impurity concentration higher than that of the first semiconductor region;
a third semiconductor region of the first conductivity type disposed on the second main surface of the high-resistance semiconductor layer and having an impurity concentration higher than that of the high-resistance semiconductor layer;
a control electrode filling each of the plurality of first trenches in contact with the second semiconductor region and connected to the first electrode; and
a second electrode formed on the third semiconductor regions,
wherein the high-resistance semiconductor layer further comprises second trenches communicating with the plurality of first trenches at both ends of longitudinal sides thereof, and each of the surface regions in which the Schottky junction is formed is surrounded by the plurality of first trenches and the second trenches.

2. The high-breakdown-voltage semiconductor device according to claim 1, wherein the second semiconductor region is formed in the bottom portion of each of the plurality of first trenches so as to be exposed from the sidewall insulating film formed on the sidewall of each of the plurality of first trenches.

3. The high-breakdown-voltage semiconductor device according to claim 1, wherein an electric field relaxation layer is disposed in an edge termination region of the high-breakdown-voltage semiconductor device surrounding the first electrode.

4. The high-breakdown-voltage semiconductor device according to claim 1, wherein a third trench is disposed in an edge termination region of the high-breakdown-voltage semiconductor device to communicate with the plurality of first trenches via the second trenches, and an electric field relaxation structure is disposed in a bottom portion of the third trench.

5. The high-breakdown-voltage semiconductor device according to claim 1, wherein the high-resistance semiconductor layer and the first to the third semiconductor regions are formed of silicon carbide.

6. The high-hreakdown-voltage semiconductor device according to claim 1, wherein the high-breakdown-voltage semiconductor device is a junction barrier Schottky diode.

* * * * *